US008638534B2

(12) United States Patent
Nakahara

(10) Patent No.: US 8,638,534 B2
(45) Date of Patent: *Jan. 28, 2014

(54) LOAD DRIVING DEVICE

(75) Inventor: Akihiro Nakahara, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 391 days.

This patent is subject to a terminal disclaimer.

(21) Appl. No.: 12/905,401

(22) Filed: Oct. 15, 2010

(65) Prior Publication Data

US 2011/0101941 A1    May 5, 2011

(30) Foreign Application Priority Data

Nov. 5, 2009 (JP) ................................. 2009-254360

(51) Int. Cl.
*H02H 3/00* (2006.01)
*H02H 3/20* (2006.01)
*H02H 9/04* (2006.01)
*B25B 7/22* (2006.01)

(52) U.S. Cl.
USPC ............................. 361/84; 361/91.1; 307/127

(58) Field of Classification Search
USPC ............. 323/276, 277, 289; 361/82, 84, 91.1, 361/59; 307/127
See application file for complete search history.

(56) References Cited

U.S. PATENT DOCUMENTS

| 4,890,185 | A | 12/1989 | Karl et al. |
| 5,166,852 | A | 11/1992 | Sano |
| 6,034,448 | A | 3/2000 | Xu et al. |
| 6,882,513 | B2 * | 4/2005 | Laraia ........................... 361/91.1 |
| 7,129,759 | B2 | 10/2006 | Fukami |
| 7,283,343 | B2 | 10/2007 | Grose et al. |
| 7,508,255 | B2 | 3/2009 | Furuichi et al. |
| 8,031,450 | B2 | 10/2011 | Nakahara |
| 8,054,106 | B2 * | 11/2011 | Nakahara ....................... 327/108 |
| 8,116,051 | B2 | 2/2012 | Nakahara |
| 8,174,808 | B2 * | 5/2012 | Nakahara ...................... 361/91.1 |
| 8,270,133 | B2 * | 9/2012 | Nakahara ...................... 361/91.1 |

(Continued)

FOREIGN PATENT DOCUMENTS

| DE | 3741394 | 6/1989 |
| EP | 0 426 103 A2 | 5/1991 |

(Continued)

OTHER PUBLICATIONS

European Search Report dated Feb. 24, 2011.

(Continued)

*Primary Examiner* — Jue Zhang
(74) *Attorney, Agent, or Firm* — McGinn IP Law Group, PLLC

(57) ABSTRACT

A load driving device according to an exemplary aspect of the present invention includes: an output transistor coupled between a first power supply line and an output terminal; the output terminal being configured to be coupled with a load; a driver circuit that controls conduction/non-conduction of the output transistor; a compensation transistor that is coupled between the output terminal and a second power supply line, and becomes conductive when the driver circuit renders the output transistor non-conductive and when a potential of the second power supply line reaches a predetermined value or greater, to maintain a non-conduction state of the output transistor; and a first resistor coupled between the second power supply line and a back gate of the compensation transistor.

19 Claims, 14 Drawing Sheets

(56) References Cited

U.S. PATENT DOCUMENTS

| | | | |
|---|---|---|---|
| 8,351,172 B2 * | 1/2013 | Nakahara | 361/84 |
| 2007/0170978 A1 * | 7/2007 | Furuichi et al. | 327/530 |
| 2009/0146628 A1 | 6/2009 | Nakahara | |
| 2009/0147422 A1 | 6/2009 | Nakahara | |
| 2009/0153225 A1 | 6/2009 | Nakahara | |
| 2009/0154041 A1 | 6/2009 | Nakahara | |
| 2011/0102956 A1 * | 5/2011 | Nakahara | 361/59 |
| 2012/0032707 A1 | 2/2012 | Nakahara | |
| 2012/0188674 A1 | 7/2012 | Nakahara | |

FOREIGN PATENT DOCUMENTS

| | | |
|---|---|---|
| EP | 2 071 723 A2 | 6/2009 |
| EP | 2 071 724 A1 | 6/2009 |
| EP | 2 071 725 A1 | 6/2009 |
| EP | 2 071 726 A2 | 6/2009 |
| JP | 2009-165113 A | 7/2009 |
| JP | 2009-165114 A | 7/2009 |

OTHER PUBLICATIONS

European Search Report dated Feb. 21, 2011.
European Search Report dated Feb. 18, 2011.
U.S. Notice of Allowance dated May 10, 2012, for U.S. Appl. No. 12/905,414.
U.S. Office Action dated Oct. 10, 2012 for U.S. Appl. No. 12/905,390.
European Office Action dated Apr. 5, 2013, with English-language translation.
Office Action dated Feb. 12, 2013, in co-pending U.S. Appl. No. 12/905,390.
European Search Report dated Mar. 20, 2012.
European Search Report dated Mar. 22, 2012.
Japanese Office Action dated Oct. 8, 2013 with English translation thereof.

* cited by examiner

LOAD DRIVING DEVICE

INCORPORATION BY REFERENCE

This application is based upon and claims the benefit of priority from Japanese patent application No. 2009-254360, filed on Nov. 5, 2009, the disclosure of which is incorporated herein in its entirety by reference.

BACKGROUND

1. Field of the Invention

The present invention relates to a load driving device, and more particularly, to a load driving device including an output transistor that controls power supply to a load.

2. Description of Related Art

Semiconductors for power supply have been widely employed as load driving devices that supply power from a power supply to a load. In one field of application, the semiconductors are used to drive actuators or lamps of vehicles.

In such a load driving device, a ground terminal of the load driving device and a ground terminal of the load may be arranged apart from each other. In this case, a voltage difference may be generated between a ground voltage of the load driving device and a ground voltage of the load due to a resistor component of a conductor between the both terminals. In some cases, the load driving device may be mounted in a unit. In this unit, a ground voltage is supplied to the load driving device through a connector. In this case, the supply of the ground voltage to the load driving device may be interrupted due to a defective connector, disconnection of a wire, or the like. In short, the ground terminal of the load driving device may be brought into an open state. In addition, the ground terminal of the load driving device may be supplied with a voltage by a parasitic device.

When the ground terminal is in the open state, there is a possibility that an output transistor having a function of switching between the load and the power supply becomes conductive, although a gate voltage of the output transistor has not reached a sufficiently high level. In other words, the output transistor may become conductive in the state where a resistance value between a drain and a source of the output transistor is high. This causes a problem that the output transistor may be destroyed due to overheating. For this reason, there is a demand for maintaining the output transistor in a non-conduction state when the ground terminal is in the open state.

Further, in the case of using the load driving device for a vehicle or the like, when the load driving device is in a standby state, there is a demand for preventing a wasteful consumption current from occurring, with a standby current on the order of microamperes.

Japanese Unexamined Patent Application Publication No. 2009-165113 discloses a solution for these demands. FIG. 14 is a circuit diagram of a load driving device 1 disclosed in Japanese Unexamined Patent Application Publication No. 2009-165113. As shown in FIG. 14, the load driving device 1 includes a power supply 10, a load 11, a driver circuit 12, a control circuit 13, a back gate control circuit 15, a compensation circuit 16, an output transistor T1, a resistor R10, a power supply terminal PWR, a ground terminal GND1, a ground terminal GND2, and an output terminal OUT. Connections among the components of the load driving device are described in detail in Japanese Unexamined Patent Application Publication No. 2009-165113, so the description thereof is herein omitted.

Now, an operation of the load driving device 1 will be described. First, a mode in which the output transistor T1 becomes conductive in a normal operation is described. In the conduction mode, a discharge transistor MN1 becomes non-conductive when a control signal S2 of low level is applied to a gate of the discharge transistor MN1. Further, a negative-polarity-side voltage VSS (e.g., 0 V) of the power supply 10 is supplied to the ground terminal GND2, and thus a compensation transistor MN7 also becomes non-conductive. Meanwhile, the output transistor T1 becomes conductive when a control signal S1 of high level, which is output from the driver circuit 12, is applied to a gate of the output transistor T1. Accordingly, in the conduction mode, the voltage value of the output terminal OUT is substantially equal to the value of a positive-polarity-side voltage VB of the power supply 10. Further, in the conduction mode, N-type MOS transistors MN5 and MN6 of a second switching portion 15b become conductive, and N-type MOS transistors MN3 and MN4 of a first switching portion 15a become non-conductive. As a result, a voltage of the ground terminal GND2 is applied to a back gate of the compensation transistor MN7. At this time, in the compensation transistor MN7, a terminal coupled to the output terminal OUT serves as a drain, and a terminal coupled to a node A serves as a source.

Next, a non-conduction mode in which the output transistor T1 becomes non-conductive in the normal operation. In the non-conduction mode, the discharge transistor MN1 becomes conductive when the control signal S2 of high level is applied to the gate thereof. Further, the negative-polarity-side voltage VSS (e.g., 0 V) of the power supply 10 is supplied to the ground terminal GND2, and thus the compensation transistor MN7 becomes non-conductive. Meanwhile, the output transistor T1 becomes non-conductive when the control signal S1 of low level is applied to the gate thereof. Accordingly, in the non-conduction mode, the voltage value of the output terminal OUT is substantially equal to the voltage value (e.g., 0 V) of the ground voltage GND1 of the load 11. Further, in the non-conduction mode, the N-type MOS transistors MN3 and MN4 of the first switching portion 15a become non-conductive, and the N-type MOS transistors MN5 and MN6 of the second switching portion 15b also become non-conductive. Thus, the voltage applied to the back gate of the compensation transistor MN7 by the back gate control circuit 15 is 0 V which is the voltage difference between the ground terminal GND2 and the output terminal OUT.

Next, a mode in which the ground terminal GND2 indicates an open state due to a defective wiring connection or the like (defective GND connection mode) is described. Assume that in the defective GND connection mode, the output transistor T1 is non-conductive. Accordingly, the output terminal OUT is 0 V. When the voltage of the ground terminal GND2 becomes higher than 0 V and exceeds a threshold voltage of the compensation transistor MN7, the compensation transistor MN7 becomes conductive, thereby short-circuiting the node A and the output terminal OUT. Thus, the voltage (e.g., 0 V) of the output terminal OUT is supplied to the node A, with the result that the voltage between the source and drain of the discharge transistor MN1 becomes substantially zero. This prevents a leak current from flowing to the gate of the output transistor T1 through the discharge transistor MN1. In other words, the gate voltage of the output transistor T1 does not rise due to a leak current. This allows the output transistor T1 to maintain the non-conduction state. Further, in the defective GND connection mode, the N-type MOS transistors MN3 and MN4 of the first switching portion 15a become conductive and the N-type MOS transistors MN5 and MN6 of the second switching portion 15b become non-conductive. As a result, the voltage applied to the back gate of the compensation transistor MN7 by the back gate control circuit 15 is equal to the voltage of the output terminal OUT. That is, in the defective GND connection mode, the back gate voltage of the compensation transistor MN7 is 0 V. In this case, in the compensation transistor MN7, the terminal coupled to the output terminal OUT serves as the source, and the terminal coupled to the node A serves as the drain.

As described above, the load driving device 1 of the prior art supplies the voltage of the output terminal OUT to the node A by rendering the compensation transistor MN7 conductive, even when the voltage of the ground terminal GND2 increases due to a defective connection of a ground wire. As a result, the load driving device 1 of the prior art brings the potential difference between both terminals of the discharge transistor MN1 to substantially zero, thereby bringing the discharge transistor MN1 into the non-conduction state. This prevents a leak current from flowing to the gate of the output transistor T1 through the discharge transistor MN1. By this operation, the load driving device 1 of the prior art can maintain the non-conduction state of the output transistor T1 even when the voltage of the ground terminal GND2 increases. Consequently, the load driving device 1 of the prior art can prevent heat generation in the output transistor T1 and also prevent breakdown of the output transistor T1. In short, the load driving device 1 of the prior art can improve the reliability at the time of malfunction caused by a disconnection of a ground wire or the like.

SUMMARY

The present inventor has found that a loss may occur under certain conditions in the prior art. Specifically, a loss occurs in which, in the case where the load driving device of the prior art shown in FIG. 14 is integrated on a semiconductor substrate, when the load driving device is operated at a high voltage within operating conditions, vertical parasitic bipolar transistors Q4 to Q7 formed to the transistors MN4, MN6, and MN7 become conductive, thereby generating a consumption current. The generation of the consumption current is described below.

In the case where the load driving device of the prior art is in a standby state, a P-well of each of the transistors MN4, MN6, and MN7 (a base of each of the parasitic bipolar transistors Q4 to Q7) is not electrically connected to a drain/source of each of the transistors MN4, MN6, and MN7 (an emitter of each of the parasitic bipolar transistors Q4 to Q7). As a result, the base of each parasitic bipolar transistor becomes open. Here, a breakdown voltage of each parasitic bipolar transistor can be represented by a breakdown voltage BVceo between an emitter and a collector when the base is open.

FIG. 13 is a graph showing breakdown voltage characteristics of a bipolar transistor. As is generally known, the breakdown voltage BVceo of the bipolar transistor when the base is open and a breakdown voltage BVcbo of the bipolar transistor when a potential is applied to the base have a correlation with a current amplification factor hFE as expressed by the following expression.

$$BVceo = BVcbo / \sqrt[4]{hFE} \quad (1)$$

In the development of a device, there is a tradeoff relation between the device size and the breakdown voltage. In this case, the breakdown voltage BVcbo is designed to have an optimum value. For instance, when a breakdown voltage of 40 V is required, the device is generally designed to have the breakdown voltage BVcbo of about 60 V.

The current amplification factor hFE of each of the parasitic bipolar transistors Q4 to Q7 shown in FIG. 14 is about 100, for example. That is, as shown in Expression (1), the breakdown voltage BVceo is about one-third of the breakdown voltage BVcbo.

Accordingly, in the case where the load driving device of the prior art is in the standby state, when a voltage higher than the breakdown voltage BVceo is applied to each of the parasitic bipolar transistors Q4 to Q7, the parasitic bipolar transistors Q4 to Q7 are broken down, with the result that a current flows through the parasitic bipolar transistors. This leads to an increase in the consumption current of the load driving device of the prior art.

Thus, in the load driving device of the prior art, the back gate of each transistor provided in the compensation circuit 16 and the back gate of each transistor provided in the back gate control circuit 15 become open (high impedance) when the load driving device is in the standby state. This causes a problem that a current flows through the parasitic bipolar transistors and the consumption current increases in the load driving device.

A first exemplary aspect of the present invention is a load driving device including: an output transistor coupled between a first power supply line and an output terminal, the output terminal being configured to be coupled with a load; a driver circuit that controls conduction/non-conduction of the output transistor; a compensation transistor that is coupled between the output terminal and a second power supply line, and becomes conductive when the driver circuit renders the output transistor non-conductive and when a potential of the second power supply line reaches a predetermined value or greater, to maintain a non-conduction state of the output transistor; and a first resistor coupled between the second power supply line and a back gate of the compensation transistor.

With the circuit configurations described above, an increase in consumption current can be suppressed in the standby state when the power supply is normally connected.

According to exemplary aspects of the present invention, it is possible to provide a load driving device capable of suppressing an increase in consumption current in the standby state when the power supply is normally connected.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments of the present invention will be described in detail below with reference to the drawings. A repeated description is omitted as appropriate to clarify the explanation.

First Exemplary Embodiment

Figure 1:
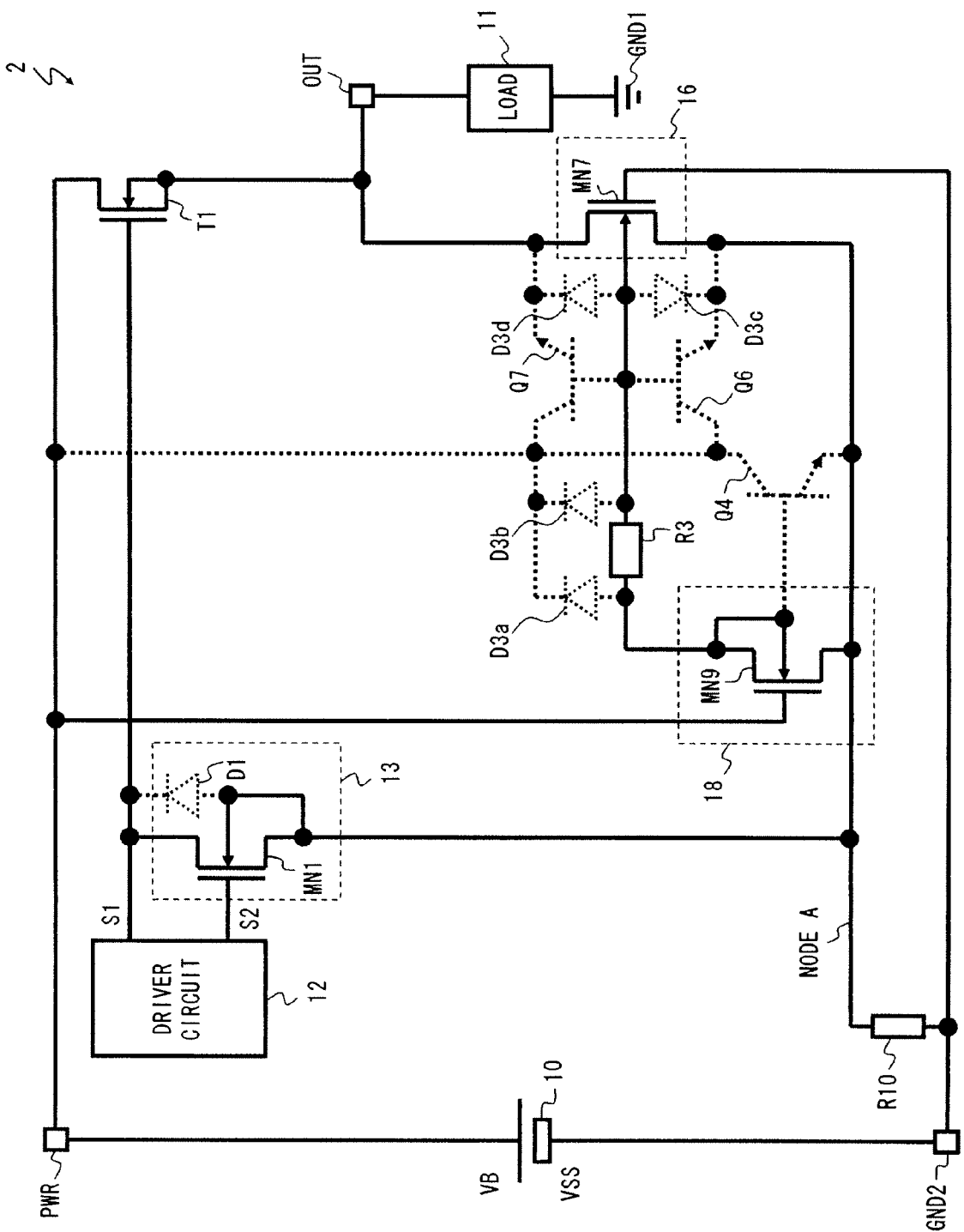
FIG. 1 is a circuit diagram of a load driving device according to a first exemplary embodiment of the present invention.

FIG. 1 shows a circuit diagram of a load driving device 2 according to a first exemplary embodiment of the present invention. As shown in FIG. 1, the load driving device 2 includes a power supply 10, a load 11, a driver circuit 12, a control circuit 13, a back gate control circuit 18, a compensation circuit 16, an output transistor T1, a resistor (a second resistor) R10, a resistor (a first resistor) R3, a power supply terminal PWR, a ground terminal GND1, a ground terminal GND2, and an output terminal OUT. The resistor R3 is a diffusion resistor, for example. In the first exemplary embodiment, a wiring line that couples the power supply 10 and the output transistor T1 through the power supply terminal PWR is referred to as a first power supply line; and a wiring line that couples the power supply 10 through the ground terminal GND2 is referred to as a second power supply line.

The power supply 10 is coupled between the power supply terminal PWR and the ground terminals GND1 and GND2. At a time of normal connection, the power supply 10 supplies a positive-polarity-side voltage VB to the power supply terminal PWR, and a negative-polarity-side voltage VSS to the ground terminals GND1 and GND2. The load 11 is coupled between the output terminal OUT and the ground terminal GND1. The load 11 is an actuator or a lamp, for example, and is a power supply destination in the load driving device 2.

The driver circuit 12 is a control device of the load driving device 2. The driver circuit 12 supplies a control signal S1 to a gate of the output transistor T1, and also supplies a control signal S2 to the control circuit 13. In the first exemplary embodiment, assume that the control signals S1 and S2 are signals having opposite phases. The driver circuit 12 controls a conduction state of the output transistor T1 according to the control signals S1 and S2.

The control circuit 13 is coupled to the gate of the output transistor T1, and is also coupled to the ground terminal GND2 through the resistor R10. The resistor R10 and the control circuit 13 are coupled through a node A. In other words, the control circuit 13 is coupled between the gate of the output transistor T1 and the node A. Conduction/non-conduction of the control circuit 13 is controlled by the control signal S2. When the control signal S2 is at high level, the control circuit 13 becomes conductive, thereby drawing electric charges from the gate of the output transistor T1. Meanwhile, when the control signal S2 is at low level, the control circuit 13 becomes non-conductive, and thus does not discharge electric charges from the gate of the output transistor T1.

More specifically, the control circuit 13 includes a discharge transistor MN1. In the first exemplary embodiment, an N-type MOS transistor is used as the discharge transistor MN1. The discharge transistor MN1 has a drain coupled to the gate of the output transistor T1, and a source and a back gate coupled to the node A. The control signal S2 is supplied to the gate of the discharge transistor MN1.

Between the back gate and the drain of the discharge transistor MN1, a parasitic diode D1 is formed as a parasitic element. More specifically, the parasitic diode D1 has an anode connected to the back gate of the discharge transistor MN1, and a cathode coupled to the gate of the output transistor T1. In this case, the parasitic diode D1 becomes conductive when a source voltage is higher than a drain voltage. When the source voltage is 0.7V or more higher than the drain voltage, for example, the parasitic diode D1 becomes conductive.

The compensation circuit 16 is coupled between the output terminal OUT and the node A. When a voltage of the ground terminal GND2 is higher than a predetermined voltage, the compensation circuit 16 causes the node A and the output terminal OUT to be short-circuited. The compensation circuit 16 includes a compensation transistor MN7. In the first exemplary embodiment, an N-type MOS transistor is used as the compensation transistor MN7. One of a source/drain of the compensation transistor MN7 is coupled to the output terminal OUT, and the other of the source/drain thereof is coupled to the node A. A gate of the compensation transistor MN7 is coupled to the ground terminal GND2, and a back gate thereof is coupled to one terminal of the resistor R3.

Parasitic bipolar transistors Q6 and Q7 and parasitic diodes D3c and D3d are formed to the compensation circuit 16 as parasitic elements. More specifically, the parasitic bipolar transistor Q6 has a base connected to the back gate of the compensation transistor MN7, an emitter connected to a source/drain diffusion region on the node A side of the compensation transistor MN7, and a collector connected to the power supply terminal PWR. The parasitic bipolar transistor Q7 has a base connected to the back gate of the compensation transistor MN7, an emitter connected to a source/drain diffusion region on the output terminal OUT side of the compensation transistor MN7, and a collector connected to the power supply terminal PWR. The parasitic diode D3c has an anode connected to the back gate of the compensation transistor MN7, and a cathode connected to the source/drain diffusion region on the node A side of the compensation transistor MN7. The parasitic diode D3d has an anode connected to the back gate of the compensation transistor MN7, and a cathode connected to the source/drain diffusion region on the output terminal OUT side of the compensation transistor MN7.

The output transistor T1 has a drain coupled to the power supply terminal PWR, and a source coupled to the output terminal OUT. The control signal S1 is supplied to the gate of the output transistor T1. When the control signal S1 is at high level, the output transistor T1 becomes conductive. When the control signal S1 is at low level, the output transistor T1 becomes non-conductive.

The resistor R3 has one terminal coupled to the back gate of the compensation transistor MN7, and the other terminal coupled to the back gate control circuit 18. Parasitic diodes D3a and D3b are formed to the resistor R3 as parasitic elements between the both terminals of the resistor R3 and the power supply terminal PWR. More specifically, the parasitic diode D3a has an anode connected to a terminal of the resistor 13 on the back gate control circuit 18 side, and a cathode coupled to the power supply terminal PWR. The parasitic diode D3b has an anode connected to a terminal of the resistor 13 on the compensation circuit 16 side, and a cathode coupled to the power supply terminal PWR.

The back gate control circuit 18 is provided between the other terminal of the resistor R3 and the node A. The back gate control circuit 18 controls the back gate of the compensation transistor MN7 through the resistor R3. In the state where the positive-polarity-side voltage VB of the power supply 10 is supplied to the power supply terminal PWR, the back gate control circuit 18 supplies a voltage of the node A to the back gate of the compensation transistor MN7, regardless of whether the negative-polarity-side voltage VSS is supplied to the ground terminal GND2.

More specifically, the back gate control circuit 18 includes a first N-type MOS transistor MN9. In the first exemplary embodiment, an N-type MOS transistor is used as the first N-type MOS transistor MN9. The first N-type MOS transistor MN9 has a drain coupled to the node A, a source coupled to the other terminal of the resistor R3, a gate coupled to the power supply terminal PWR, and a back gate coupled to the source.

A parasitic bipolar transistor Q4 is formed to the back gate control circuit 18 as a parasitic element. More specifically, the parasitic bipolar transistor Q4 has a base connected to the back gate of the first N-type MOS transistor MN9, an emitter connected to the drain diffusion region on the node A side of the first N-type MOS transistor MN9, and a collector coupled to the power supply terminal PWR.

Next, an operation of the load driving device 2 when the power supply 10 is normally connected will be described. When the control signal S1 is at high level and the control signal S2 is at low level, the discharge transistor MN1 becomes non-conductive and the output transistor T1 becomes conductive. Accordingly, the positive-polarity-side voltage VB output by the power supply 10 is supplied to the load 11 as power.

Meanwhile, when the control signal S1 is at low level and the control signal S2 is at high level, the discharge transistor MN1 becomes conductive, thereby drawing electric charges from the gate of the output transistor T1 to the ground terminal GND2. Accordingly, when the discharge of the gate charge of the output transistor T1 is completed, a gate voltage of the output transistor T1 becomes 0 V. That is, a voltage between the gate and the source of the output transistor T1 is low, and thus the output transistor T1 becomes non-conductive. Thus, no power is supplied to the load 11 from the power supply 10, and a voltage of the output terminal OUT becomes substantially 0 V.

Further, in the state where the power supply 10 is normally connected, the first N-type MOS transistor MN9 becomes conductive, and thus the negative-polarity-side voltage VSS is applied to the back gate of the compensation transistor MN7 through the resistor R10 and the resistor R3. The parasitic diodes D3a to D3d are reversely biased in this case, so the parasitic diodes D3a to D3d become non-conductive. Further, the parasitic bipolar transistors Q4, Q6, and Q7 are short-circuited so that a voltage between the emitter and the base becomes substantially 0 V. Accordingly, the amount of current flowing to the node A from the parasitic elements due to the conduction of the first N-type MOS transistor MN9 is little. Further, the voltage of the node A and the voltage of the ground terminal GND2 are substantially the same. Thus, the compensation transistor MN7 coupled between the node A and the output terminal OUT does not become conductive. In other words, the compensation transistor MN7 is deactivated.

Figure 2:
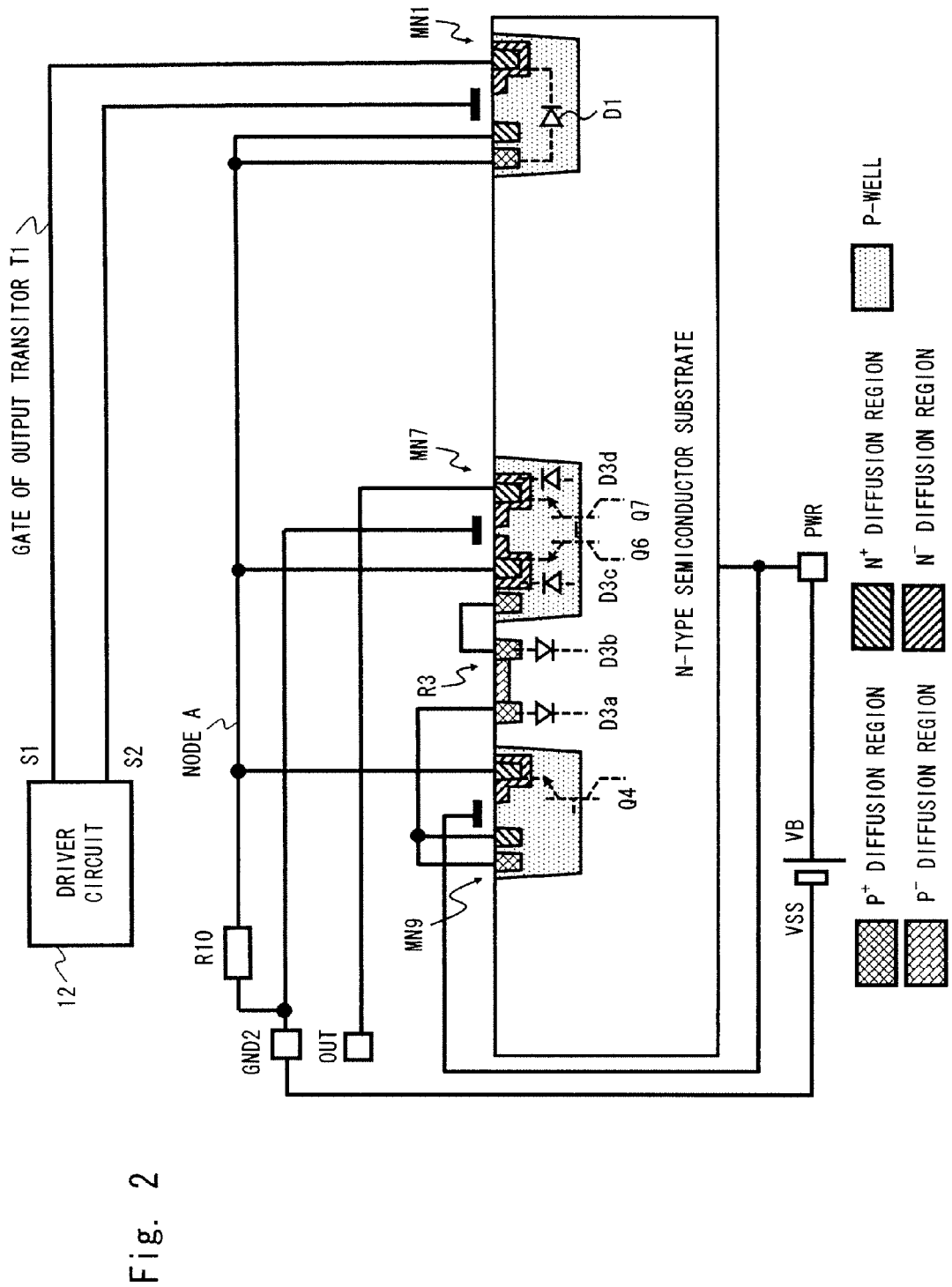
FIG. 2 is a sectional view of a semiconductor device illustrating parasitic elements formed in the load driving device according to the first exemplary embodiment of the present invention.

To explain the parasitic elements in more detail, FIG. 2 shows a sectional view illustrating the control circuit 13, the compensation circuit 16, the back gate control circuit 18, and the resistor R3. The sectional view of FIG. 2 shows an example in which the control circuit 13, the compensation circuit 16, the back gate control circuit 18, and the resistor R3 are formed on a single N-type semiconductor substrate.

As shown in FIG. 2, the resistor R3 is formed on the N-type semiconductor substrate using P-type diffusion regions. In the resistor R3, for example, resistor connecting terminals are formed at both ends of the resistor R3 using $P^+$ diffusion regions having a high impurity concentration. Further, a resistor portion is formed using a $P^-$ diffusion region having a low impurity concentration that connects the connecting terminals.

The discharge transistor MN1 of the control circuit 13 includes a P-well (hereinafter, referred to as "back gate of the discharge transistor MN1" as needed) which is made of a P-type semiconductor and is formed on the N-type semiconductor substrate. In the P-well, a $P^+$ diffusion region and $N^+$ diffusion regions are formed. The $P^+$ diffusion region serves as a potential supply terminal for supplying a potential as a back gate voltage of the discharge transistor MN1 to the P-well. The $N^+$ diffusion regions form source and drain regions of the discharge transistor MN1. On the periphery of the $N^+$ diffusion region forming the drain, an $N^-$ diffusion region having a low impurity concentration is formed. The $N^-$ diffusion region provides a high breakdown voltage between the drain and the back gate of the discharge transistor MN1. Further, above an upper layer of the N-type semiconductor substrate, in a region extending over two N+ diffusion regions, a gate electrode is formed via a gate oxide film.

The compensation transistor MN7 of the compensation circuit 16 and the first N-type MOS transistor MN9 of the back gate control circuit 18 are composed of elements having substantially the same configuration as the discharge transistor MN1. The compensation transistor MN7 has a configuration in which the N" diffusion region is formed on the periphery of each of the $N^+$ diffusion regions forming the source and the drain, and has a high breakdown voltage between the drain and the back gate and between the source and the back gate.

The parasitic bipolar transistor Q4 has a base serving as the back gate of the first N-type MOS transistor MN9, an emitter serving as the $N^+$ diffusion region coupled to the node A in the first N-type MOS transistor MN9, and a collector serving as the N-type semiconductor substrate. The parasitic bipolar transistor Q6 has a base serving as the back gate of the compensation transistor MN7, an emitter serving as the N$^+$ diffusion region coupled to the node A in the compensation transistor MN7, and a collector serving as the N-type semiconductor substrate. The parasitic bipolar transistor Q7 has a base serving as the back gate of the compensation transistor MN7, an emitter serving as the N$^+$ diffusion region coupled to the output terminal OUT in the compensation transistor MN7, and a collector serving as the N-type semiconductor substrate.

The parasitic diode D1 has an anode serving as the back gate of the discharge transistor MN1, and a cathode serving as the N$^+$ diffusion region coupled to the gate of the output transistor T1 in the discharge transistor MN1. The parasitic diode D3a has an anode serving as the N$^+$ diffusion region coupled to the back gate of the first N-type MOS transistor MN9 in the resistor R3, and a cathode serving as the N-type semiconductor substrate. The parasitic diode D3b has an anode serving as the N$^+$ diffusion region coupled to the back gate of the compensation transistor MN7 in the resistor R3, and a cathode serving as the N-type semiconductor substrate. The parasitic diode D3c has an anode serving as the back gate of the compensation transistor MN7, and a cathode serving as the N$^+$ diffusion region coupled to the node A in the compensation transistor MN7. The parasitic diode D3d has an anode serving as the back gate of the compensation transistor MN7, and a cathode serving as the N$^+$ diffusion region coupled to the output terminal OUT in the compensation transistor MN7.

In a typical NPN bipolar transistor, a breakdown voltage between a collector and an emitter thereof when a base of the NPN bipolar transistor is supplied with a fixed potential is higher than that when the base is open. In the prior art, the base of the parasitic bipolar transistor may be open. Thus, in the prior art, there is a possibility that the breakdown voltage BVceo between the collector and the emitter of the parasitic bipolar transistor decreases to a maximum applied voltage of the power supply 10 or lower.

In the first exemplary embodiment, a fixed potential is applied to the base of each of the parasitic bipolar transistors Q4, Q6, and Q7. As a result, the parasitic bipolar transistors Q4, Q6, and Q7 have a high breakdown voltage between the collector and the emitter thereof. The device is designed in advance such that the breakdown voltage between the collector and the emitter of each parasitic bipolar transistor at this time becomes higher than the maximum applied voltage of the power supply 10. Accordingly, the parasitic bipolar transistors Q4, Q6, and Q7 maintain the non-conduction state until the maximum applied voltage of the power supply 10 is reached.

As shown in FIGS. 1 and 2, the bases of the parasitic bipolar transistors Q4, Q6, and Q7 are each coupled to the wiring line of the back gate of the compensation transistor MN7. Further, when the load driving device 2 is in a standby state (in the standby state in which no power is supplied from the output transistor T1 to the load 11), the first N-type MOS transistor MN9 is conductive. At this time, the negative-polarity-side voltage VSS is supplied to the bases of the parasitic bipolar transistors Q4, Q6, and Q7 through the ground terminal GND. This allows the parasitic bipolar transistors Q4, Q6, and Q7 to maintain the non-conduction state until the maximum applied voltage is reached. That is, since no current flows through the parasitic bipolar transistors, the load driving device 2 can suppress an increase in consumption current.

Next, a description is given of an operation of the load driving device 2 when the ground terminal GND2 is brought into an open state due to a wiring defective connection or the like (hereinafter, referred to simply as "defective GND connection mode"). In the defective GND connection mode, assume that the output transistor T1 is non-conductive. Accordingly, the voltage of the output terminal OUT is 0 V. When the voltage of the ground terminal GND2 becomes higher than 0 V and exceeds a threshold voltage of the compensation transistor MN7, the compensation transistor MN7 becomes conductive, thereby short-circuiting the node A and the output terminal OUT.

More specifically, in the defective GND connection mode, the first N-type MOS transistor MN9 of the back gate control circuit 18 becomes conductive. As a result, a current flows from the ground terminal GND2 to the back gate of the compensation transistor MN7 through the resistor R10 and the resistor R3. This current flows to the output terminal OUT through the parasitic diode D3d. Meanwhile, since the cathode of the parasitic diode D3c is coupled to the node A, voltages at the anode and cathode of the parasitic diode D3c are substantially the same. Accordingly, no current flows through the parasitic diode D3c. Since the voltage on the cathode side of the parasitic diodes D3a and D3b is equal to the positive-polarity-side voltage VB, no forward voltage is generated.

Here, the resistance value of the resistor R3 is adjusted in advance so that a forward voltage of the parasitic diode D3d does not exceed a threshold voltage of the parasitic bipolar transistor Q7. Thus, the forward voltage of the parasitic diode D3d is about 0.5 V, for example. The parasitic bipolar transistor Q7 becomes non-conductive, because the voltage between the emitter and the base is about 0.7 V or less. That is, the voltage of the back gate of the compensation transistor MN7 is higher than the voltage (e.g., 0 V) of the output terminal OUT by about 0.5 V. In this case, the compensation transistor MN7 has a source coupled to the output terminal OUT, and a drain coupled to the node A. Then, a voltage substantially equal to the voltage of the node A is applied to the gate of the compensation transistor MN7. This brings the compensation transistor MN7 into a conduction state.

Thus, the voltage (e.g., 0 V) of the output terminal OUT is supplied to the node A. As a result, a potential difference between the source and the drain of the discharge transistor MN1 becomes substantially zero. Therefore, no leak current flows to the gate of the output transistor T1 through the discharge transistor MN1. In other words, the output transistor T1 maintains a non-conduction state.

As described above, the load driving device 2 according to the first exemplary embodiment supplies the voltage of the output terminal OUT to the node A by bringing the compensation transistor MN7 into the conduction state even when the voltage of the ground terminal GND 2 increases due to a defective connection of a ground wire. Thus, the load driving device 2 according to the first exemplary embodiment makes the potential difference between the both ends of the discharge transistor MN1 substantially zero, thereby bringing the discharge transistor MN1 into the non-conduction state. This prevents a leak current from flowing to the gate of the output transistor T1 through the discharge transistor MN1. By this operation, the load driving device 2 according to the first exemplary embodiment can maintain the non-conduction state of the output transistor T1 even when the voltage of the ground terminal GND2 increases. Consequently, the load driving device 2 according to the first exemplary embodiment can prevent heat generation in the output transistor T1 due to an increase in voltage of the ground terminal GND2, and can prevent breakdown of the output transistor T1. In short, the load driving device 2 according to the first exemplary embodiment can improve the reliability at the time of malfunction caused by a disconnection of a ground wire or the like.

Second Exemplary Embodiment

The load driving device 2 described above can prevent a malfunction associated with the off state of the output transistor T1 due to an increase in voltage of the ground terminal GND2. However, it is difficult to protect the load driving device 2 in the case where the power supply 10 is reversely connected. Meanwhile, according to a second exemplary embodiment of the present invention, it is possible to achieve the prevention of a malfunction associated with the off state of the output transistor T1 due to an increase in voltage of the ground terminal GND2, as well as the protection of the load driving device when the power supply 10 is reversely connected.

Furthermore, the second exemplary embodiment can solve the following problem. That is, as described above, when the load driving device is used for a vehicle or the like, the ground terminal GND1 on the load 11 side and the ground terminal GND2 on the control circuit 13 side are grounded at different points. Accordingly, there is a potential difference between the both terminals. In the load driving device 2 according to the first exemplary embodiment, in the standby state when the power supply 10 is normally connected, if the potential of the ground terminal GND2 is higher than the potential of the ground terminal GND1, there is a possibility that the output transistor T1 is not reliably rendered non-conductive. Meanwhile, in a load driving device 3 according to the second exemplary embodiment, in the standby state when the power supply 10 is normally connected, the output transistor T1 can be reliably rendered non-conductive, even when the potential of the ground terminal GND1 is different from the potential of the ground terminal GND2.

Figure 3:
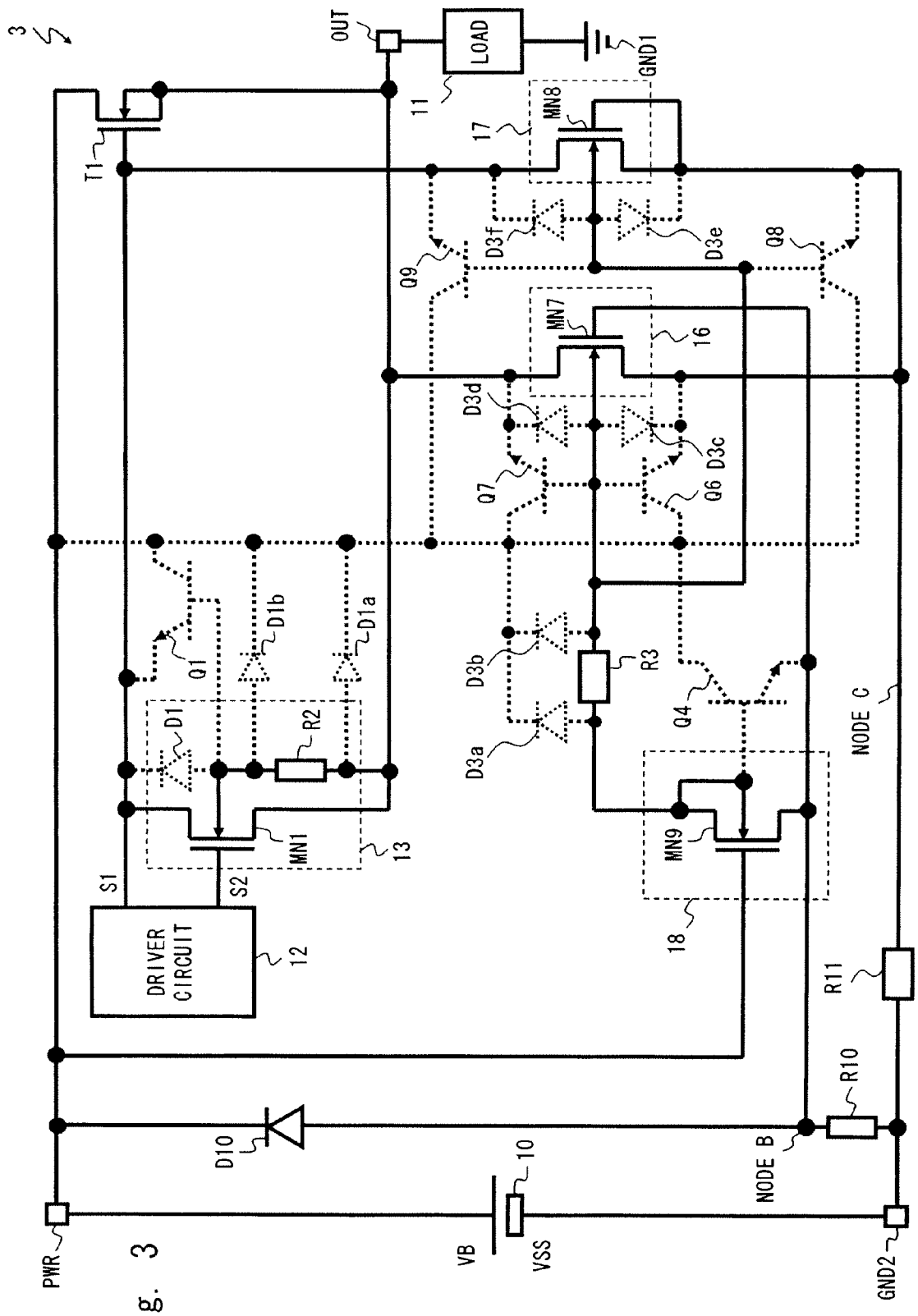
FIG. 3 is a circuit diagram of a load driving device according to a second exemplary embodiment of the present invention.

FIG. 3 shows a circuit diagram of the load driving device 3 according to the second exemplary embodiment of the present invention. In comparison with the load driving device 2 shown in FIG. 1, the load driving device 3 shown in FIG. 3 further includes a protection diode (e.g., a clamp diode) D10, a resistor (a third resistor) R2, a resistor (a fourth resistor) R11, and a reverse connection protection circuit 17. The resistor R2 is a diffusion resistor, for example. In the following description, components of the second exemplary embodiment similar to those of the first exemplary embodiment are denoted by the same reference symbols, and the description thereof is omitted.

Although the control circuit 13 of the second exemplary embodiment is similar to the control circuit 13 of the first exemplary embodiment, the connection destinations of the source and the back gate of the discharge transistor MN1 of the second exemplary embodiment differ from those of the first exemplary embodiment. In the second exemplary embodiment, the source of the discharge transistor MN1 is coupled to the output terminal OUT. Further, the back gate of the discharge transistor MN1 is coupled to the output terminal OUT through the resistor R2.

A parasitic bipolar transistor Q1 is formed as a parasitic element to the discharge transistor MN1, in addition to the parasitic diode D1. More specifically, the parasitic bipolar transistor Q1 has a base connected to the back gate of the discharge transistor MN1, an emitter coupled to the gate of the output transistor T1, and a collector coupled to the power supply terminal PWR. Also in the case of the load driving device 2 shown in FIG. 1, the parasitic bipolar transistor Q1 is formed to the discharge transistor MN1. However, the parasitic bipolar transistor Q1 is omitted in FIG. 1, because an operation of the parasitic bipolar transistor Q1 becomes an issue only when the power supply 10 is reversely connected.

Parasitic diodes D1a and D1b are formed to the resistor R2 as parasitic elements. The parasitic diode D1a has an anode connected to a terminal of the resistor R2 on the output terminal OUT side, and a cathode coupled to the power supply terminal PWR. The parasitic diode D1b has an anode connected to a terminal of the resistor R2 on the back gate side of the discharge transistor MN1, and a cathode coupled to the power supply terminal PWR.

The diode D10 has a cathode coupled to the power supply terminal PWR, and an anode coupled to the ground terminal GND2 through the resistor R10. A node on the anode side of the diode D10 is referred to as a node B. That is, the node A of the first exemplary embodiment is referred to as the node B in the second exemplary embodiment.

The reverse connection protection circuit 17 is coupled to the gate of the output transistor T1 and is also coupled to the ground terminal GND2 through the resistor R11. Note that the resistor R11 and the reverse connection protection circuit 17 are coupled through a node C. That is, the reverse connection protection circuit 17 is coupled between the gate of the output transistor T1 and the node C. The reverse connection protection circuit 17 supplies electric charges to the gate of the output transistor T1 when the power supply 10 is reversely connected, thereby bringing the output transistor T1 into a conduction state.

The reverse connection protection circuit 17 includes a protection transistor MN8. In the second exemplary embodiment, an N-type MOS transistor is used as the protection transistor MN8. One of a source/drain of the protection transistor MN8 is coupled to the gate of the output transistor T1, and the other of the source/drain and a gate thereof are commonly coupled to the node C. Further, a back gate of the protection transistor MN8 is coupled to one terminal of the resistor R3.

Parasitic bipolar transistors Q8 and Q9 and parasitic diodes D3e and D3f are formed to the reverse connection protection circuit 17 as parasitic elements. More specifically, the parasitic bipolar transistor Q8 has a base connected to the back gate of the protection transistor MN8, an emitter connected to a source/drain diffusion region on the node C side in the protection transistor MN8, and a collector coupled to the power supply terminal PWR. The parasitic bipolar transistor Q9 has a base connected to the back gate of the protection transistor MN8, an emitter connected to a source/drain diffusion region on the gate side of the output transistor T1 in the protection transistor MN8, and a collector coupled to the power supply terminal PWR. The parasitic diode D3e has an anode connected to the back gate of the protection transistor MN8, and a cathode connected to the source/drain diffusion region on the node C side in the protection transistor MN8. The parasitic diode D3f has an anode connected to the back gate of the protection transistor MN8, and a cathode connected to the source/drain diffusion region on the gate side of the output transistor T1 in the protection transistor MN8.

Although the compensation circuit 16 of the second exemplary embodiment is similar to that the compensation circuit 16 of the first exemplary embodiment, the connection destinations of the other of the source/drain and the gate of the compensation transistor MN7 are different from those of the first exemplary embodiment. One of the source/drain of the compensation transistor MN7 of the second exemplary embodiment is coupled to the output terminal OUT, and the other of the source/drain thereof is coupled to the node C. Further, the gate of the compensation transistor MN7 is coupled to the node B, and the back gate thereof is coupled to one terminal of the resistor R3. Unlike the first exemplary embodiment, the emitter of the parasitic bipolar transistor Q6 is coupled to the node C. The resistor R11 is coupled in series between the ground terminal GND2 and the node C.

Next, an operation of the load driving device 3 when the power supply 10 is normally connected will be described. When the control signal S1 is at high level and the control signal S2 is at low level, the discharge transistor MN1 becomes non-conductive and the output transistor T1 becomes conductive. Thus, the positive-polarity-side voltage VB output by the power supply 10 is supplied to the load 11 as power.

Meanwhile, when the control signal S1 is at low level and the control signal S2 is at high level, the discharge transistor MN1 becomes conductive, thereby drawing electric charges from the gate of the output transistor T1 to the output terminal OUT. Accordingly, after the discharge of electric charges from the gate of the output transistor T1 is completed, the gate voltage of the output transistor T1 becomes 0 V. That is, the voltage between the gate and the source of the output transistor T1 becomes 0 V, and the output transistor T1 becomes non-conductive. Thus, no power is supplied to the load 11 from the power supply 10, and the voltage of the output terminal OUT becomes substantially 0 V.

Further, in the state where the power supply 10 is normally connected, the first N-type MOS transistor MN9 becomes conductive. Accordingly, the negative-polarity-side voltage VSS is applied to the back gates of the compensation transistor MN7 and the protection transistor MN8 through the resistor R10 and the resistor R3. At this time, the parasitic diodes D3a to D3f are reversely biased and thus become non-conductive. The parasitic bipolar transistors Q4, and Q6 to Q9 are short-circuited so that the voltage between the emitter and the base thereof becomes substantially 0 V. Accordingly, when the first N-type MOS transistor MN9 becomes conductive, almost no current flows from the parasitic elements to the node B. The voltage of the node B is substantially equal to the voltage of the ground terminal GND2. That is, since the voltage according to the negative-polarity-side voltage VSS is supplied to each back gate of the compensation transistor MN7 and the protection transistor MN8, the compensation transistor MN7 and the protection transistor MN8 become non-conductive. In other words, the compensation transistor MN7 and the protection transistor MN8 are deactivated.

Figure 4:
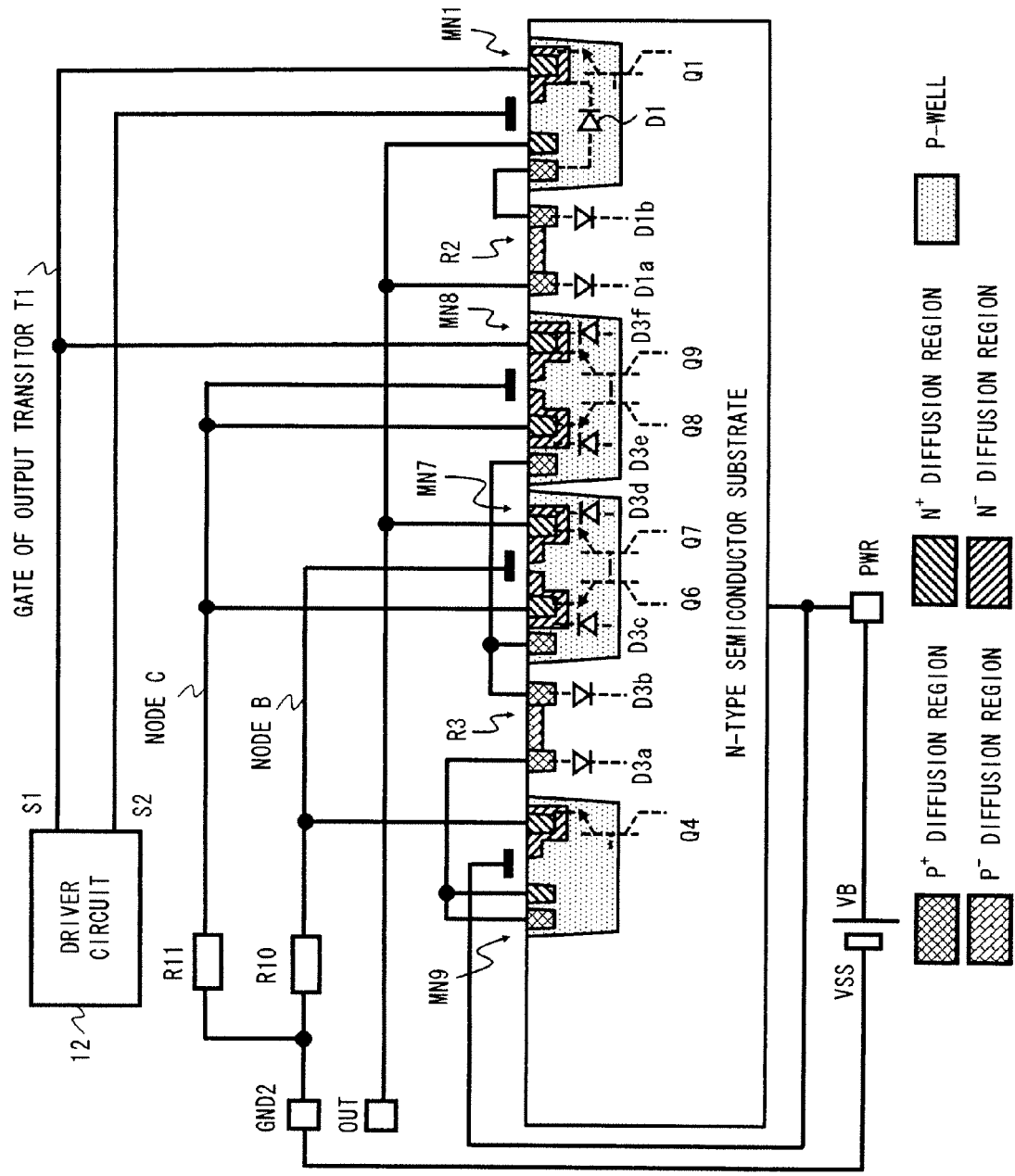
FIG. 4 is a sectional view of a semiconductor device illustrating parasitic elements formed in the load driving device according to the second exemplary embodiment of the present invention.

To explain the parasitic elements in more detail, FIG. 4 shows a sectional view illustrating the control circuit 13, the compensation circuit 16, the back gate control circuit 18, the reverse connection protection circuit 17, the resistor 2, and the resistor R3. The sectional view of FIG. 4 shows an example in which the control circuit 13, the compensation circuit 16, the back gate control circuit 18, the reverse connection protection circuit 17, the resistor 2, and the resistor R3 are formed on a single N-type semiconductor substrate. In the following description, components of the second exemplary embodiment similar to those of the first exemplary embodiment are denoted by the same reference symbols, and the description thereof is omitted.

As shown in FIG. 4, the discharge transistor MN1, the compensation transistor MN7, the protection transistor MN9, and the resistor R3 have substantially the same configurations as those of the load driving device 2 shown in FIG. 2.

The protection transistor MN8 of the reverse connection protection circuit 17 is composed of elements having substantially the same configuration as the discharge transistor MN1. The protection transistor MN8 has a configuration in which the N⁻ diffusion region is formed also on the periphery of each of the N⁺ diffusion regions forming the source and the drain, and has a high breakdown voltage between the drain and the back gate and between the source and the back gate. Further, the resistor R2 is composed of elements having substantially the same configuration as the resistor R3.

The parasitic bipolar transistor Q1 has a base serving as the back gate of the discharge transistor MN1, an emitter serving as the N⁺ diffusion region coupled to the gate of the output transistor T1 in the discharge transistor MN1, and a collector serving as the N-type semiconductor substrate. The parasitic diode D1a has an anode serving as the P⁺ diffusion region coupled to the output terminal OUT in the resistor R2, and a cathode serving as the N-type semiconductor substrate. The parasitic diode D1b has an anode serving as the P⁺ diffusion region coupled to the back gate of the discharge transistor Q1 in the resistor R2, and a cathode serving as the N-type semiconductor substrate.

The parasitic bipolar transistor Q8 has a base serving as the back gate of the protection transistor MN8, an emitter serving as the N⁺ diffusion region coupled to the node C in the protection transistor MN8, and a collector serving as the N-type semiconductor substrate. The parasitic bipolar transistor Q9 has a base serving as the back gate of the protection transistor MN8, an emitter serving as the N⁺ diffusion region coupled to the gate of the output transistor T1 in the protection transistor MN8, and a collector serving as the N-type semiconductor substrate. The parasitic diode D3e has an anode serving as the back gate of the protection transistor MN8, and a cathode serving as the N⁺ diffusion region coupled to the node C in the protection transistor MN8. The parasitic diode D3f has an anode serving as the back gate of the protection transistor MN8, and a cathode serving as the N⁺ diffusion region coupled to the gate of the output transistor T1 in the protection transistor MN8.

In this case, as shown in FIGS. 3 and 4, the bases of the parasitic bipolar transistors Q4 and Q6 to Q9 are each coupled to the wiring line of the back gate of each of the compensation transistor MN7 and the protection transistor MN8. Further, when the load driving device 3 is in the standby state, the first N-type MOS transistor MN9 is conductive. Accordingly, the negative-polarity-side voltage VSS of the power supply 10 is supplied to the bases of the parasitic bipolar transistors Q4 and Q6 to Q9 through the ground terminal GND. As a result, as in the case with the first exemplary embodiment, the parasitic bipolar transistors Q4 and Q6 to Q9 maintain the non-conduction state until the maximum applied voltage is reached. In other words, the load driving device 3 according to the second exemplary embodiment can suppress an increase in consumption current, since no current flows through the parasitic bipolar transistors.

Next, a description is given of an operation of the load driving device 3 when the ground terminal GND2 is brought into the open state (defective GND connection mode) due to a wiring defective connection or the like. Assume that in the defective GND connection mode, the output transistor T1 is non-conductive. In this case, the discharge transistor MN1 is coupled between the gate of the output transistor T1 and the output terminal OUT. Thus, in the defective GND connection mode, the discharge transistor MN1 does not allow any leak current to flow from the ground terminal GND2 to the gate of the output transistor T1, regardless of the state of the compensation transistor MN7. Accordingly, the parasitic bipolar transistor Q1 becomes non-conductive. In other words, the parasitic bipolar transistor Q1 is deactivated.

When the first N-type MOS transistor MN9 becomes conductive, a voltage of about 0.5 V is applied to the back gates of the compensation transistor MN7 and the protection transistor MN8, as in the case of the first exemplary embodiment. Thus, in the protection transistor MN8, the terminal coupled to the output terminal OUT serves as the source, and the terminal coupled to the node C serves as the drain. Accordingly, the protection transistor MN8 becomes conductive. Also the compensation transistor MN7 becomes conductive for the same reason as the first exemplary embodiment, and thus the voltage of the node C becomes equal to the voltage (e.g., 0 V) of the output terminal OUT. As a result, the voltage at the drain of the protection transistor MN8 is equal to the voltage at the source thereof, and no current flows to the gate of the output transistor T1 through the protection transistor MN8. That is, the output transistor T1 maintains the non-conduction state.

As described above, even when the voltage of the ground terminal GND2 increases due to a defective connection of a ground wire, the load driving device 3 according to the second exemplary embodiment supplies the voltage of the output terminal OUT to the node C by rendering the compensation transistor MN7 conductive. As a result, the load driving device 3 according to the second exemplary embodiment brings the potential difference between both terminals of the protection transistor MN8 to substantially zero, thereby bringing the protection transistor MN8 into the non-conduction state. This prevents a leak current from flowing to the gate of the output transistor T1 through the protection transistor MN8. By this operation, the load driving device 3 according to the second exemplary embodiment can maintain the non-conduction state of the output transistor T1 even when the voltage of the ground terminal GND2 increases. Consequently, the load driving device 3 according to the second exemplary embodiment can prevent heat generation in the output transistor T1 due to an increase in voltage of the ground terminal GND2 and can also prevent breakdown of the output transistor T1. In short, the load driving device 3 according to the second exemplary embodiment can improve the reliability at the time of malfunction caused by a disconnection of a ground wire or the like.

Figure 5:
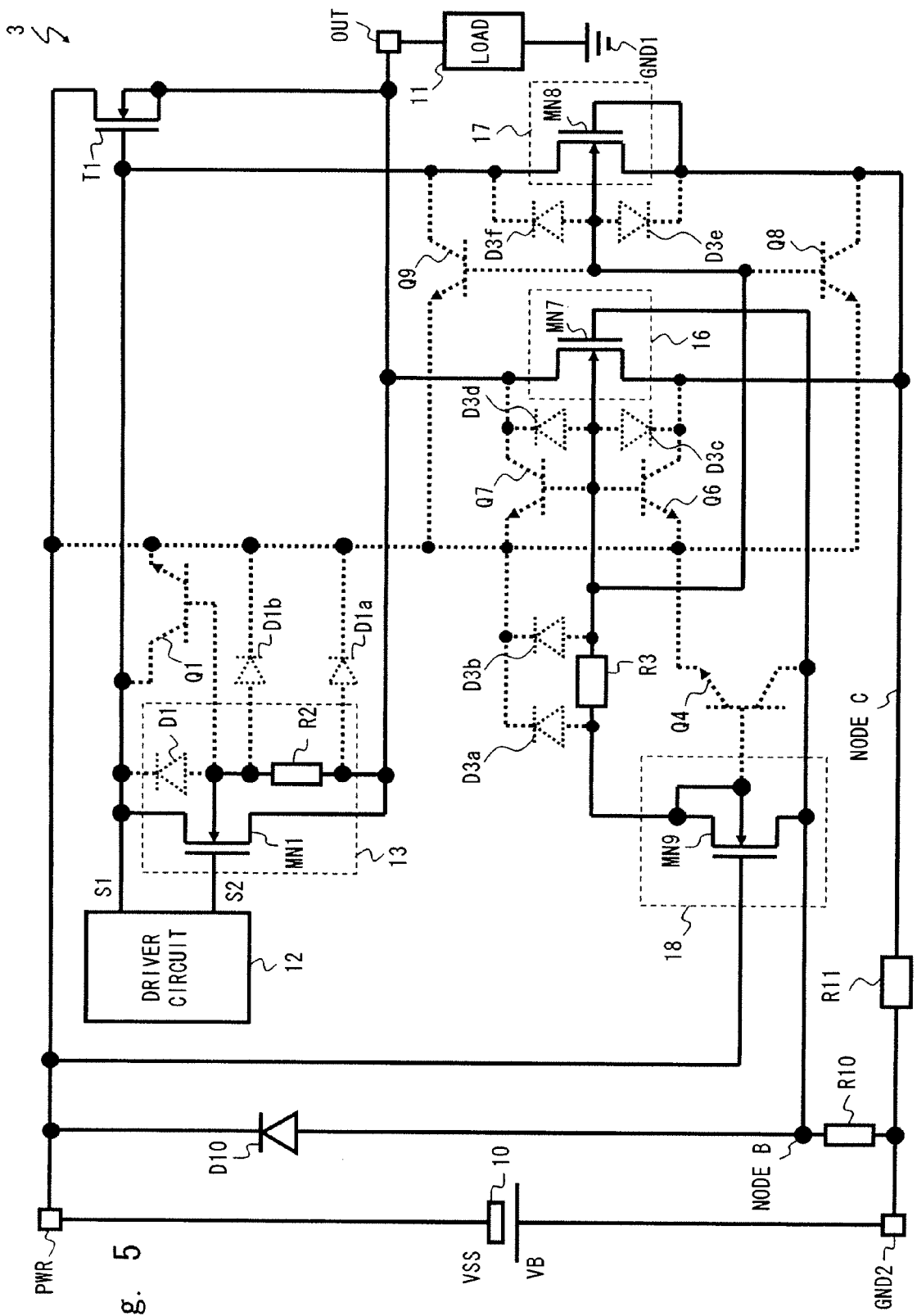
FIG. 5 is a circuit diagram showing a case where a power supply is reversely connected in the load driving device according to the second exemplary embodiment of the present invention.
Figure 6:
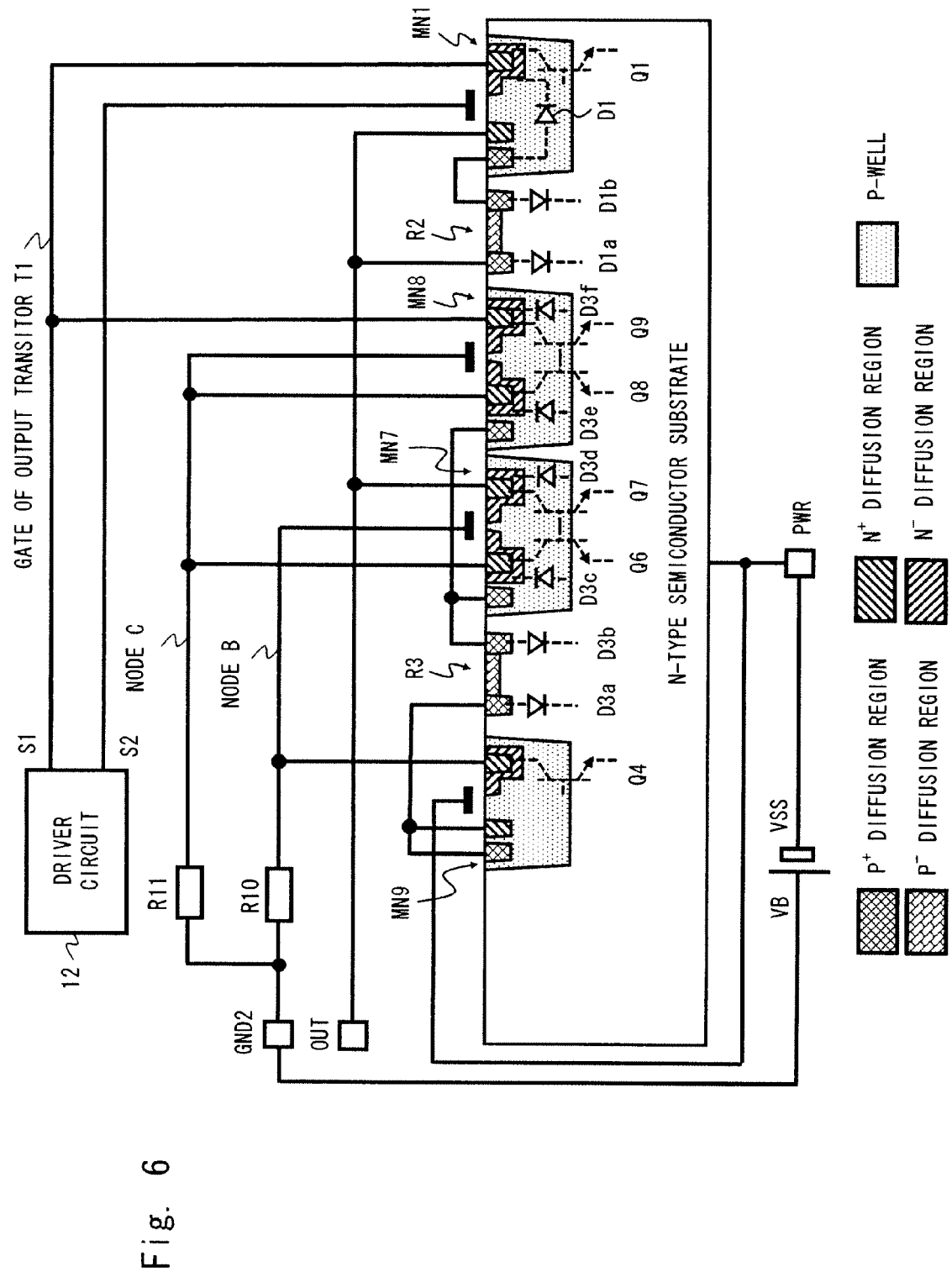
FIG. 6 is a sectional view of the semiconductor device illustrating the parasitic elements formed in the load driving device according to the second exemplary embodiment of the present invention.

Next, a description is given of an operation of the load driving device 3 in an operation mode when the power supply 10 is reversely connected by mistake (hereinafter, referred to as "reverse connection mode"). FIG. 5 shows a circuit diagram of the load driving device 3 in the reverse connection mode. FIG. 6 shows a sectional view illustrating devices constituting the load driving device 3 in the reverse connection mode.

In the reverse connection mode, the positive-polarity-side voltage VB and the negative-polarity-side voltage VSS of the power supply 10 are reversed. As a result, the emitter and the collector of each of the parasitic bipolar transistors Q1, Q4, and Q6 to Q9 are reversed. This is because the high-potential side and the low-potential side are reversed due to the reverse connection of the power supply 10. The emitter and collector of each parasitic bipolar transistor are different from those when the power supply 10 is normally connected, but are denoted by the same reference symbols as those when the power supply 10 is normally connected.

In the reverse connection mode, when a current flows from the ground terminal GND2 to the power supply terminal PWR through the diode D10, the voltage of the node B becomes equal to a forward voltage (e.g. 0.7 V) of the diode D10. Further, when a current flows from the ground terminal GND1 to the power supply terminal PWR through the load 11 and the diode between the back gate and the drain of the output transistor T1, the voltage of the output terminal OUT becomes equal to a forward voltage (e.g., 0.7 V) of the parasitic diode (diode between the back gate and the drain) of the output transistor T1. In this case, if the protection transistor MN8 can be rendered conductive, electric charges are supplied from the ground terminal GND2, to which the positive-polarity-side voltage VB is supplied, to the gate of the output transistor T1, thereby allowing the output transistor T1 to be conductive. Therefore, the load driving device 3 can suppress heat generation in the output transistor T1 and can prevent breakdown of the load driving device.

Since the negative-polarity-side voltage VSS is applied to the gate of the first N-type MOS transistor MN9, the first N-type MOS transistor MN9 becomes non-conductive. At this time, the back gate voltage of the compensation transistor MN7 is 0.7 V or less higher than the voltage of the output terminal OUT, due to the presence of the parasitic diode D3d. Similarly, the back gate voltage of the protection transistor MN8 is 0.7 V or less higher than the voltage of the output terminal OUT, due to the presence of the parasitic diode D3f. This indicates that the back gate voltage of each of the compensation transistor MN7 and the protection transistor MN8 is a low voltage. In this case, the compensation transistor MN7 has a gate (node B) voltage of about 0.7 V, a high drain (node C) voltage, a source (output terminal OUT) voltage of about 0.7 V, and a back gate voltage of about 0.7 V. Accordingly, the compensation transistor MN7 becomes non-conductive. Meanwhile, the protection transistor MN8 has a high gate voltage, a high drain (node C) voltages, a source (output terminal OUT) voltage of about 0.7 V, and a back gate voltage of about 0.7 V. Accordingly, the protection transistor MN8 becomes conductive. As a result, electric charges are supplied from the ground terminal GND2 to the gate of the output transistor T1 through the protection transistor MN8.

At this time, if the parasitic bipolar transistor Q1 formed in the discharge transistor MN1 becomes conductive, there is a possibility that the gate charge of the output transistor T1 is drawn and the output transistor T1 is inhibited from being conductive. In the reverse connection mode, there is a path through which a current flows from the ground terminal GND1 to the power supply terminal PWR through the load 11 and the back gate of the discharge transistor MN1. Hence, the parasitic diodes D1a and D1b, which are formed at the both terminals of the resistor R2, prevent the parasitic bipolar transistor Q1 from becoming conductive.

Specifically, in the reverse connection mode, when a current flows to the parasitic diode D1 through the resistor R2, a current smaller than that of the parasitic diode D1a flows to the parasitic diode D1b due to the effect of the resistor R2. At this time, a forward voltage of about 0.7 V is generated at the parasitic diode D1a, and a forward voltage of about 0.5 V is generated at the parasitic diode D2b. A forward voltage of the parasitic diode D1b is equal to a voltage between the base and the emitter of the parasitic bipolar transistor Q1, and thus the parasitic bipolar transistor Q1 becomes non-conductive. This prevents the electric charges supplied from the protection transistor MN8 to the gate of the output transistor T1 from being drawn by the parasitic bipolar transistor Q1, and thus the output transistor T1 becomes conductive.

In this manner, in the second exemplary embodiment, the same effects as those of the first exemplary embodiment can be obtained. Further, the load driving device 3 according to the second exemplary embodiment brings the output transistor T1 into the conduction state when the power supply 10 is reversely connected, thereby making it possible to suppress heat generation in the output transistor T1 and prevent breakdown of the load driving device 3. Furthermore, the load driving device 3 according to the second exemplary embodiment causes the gate and the drain of the output transistor T1 to be short-circuited in the standby state when the power supply 10 is normally connected. This makes it possible to reliably bring the output transistor T1 into the non-conduction state, regardless of the potential difference between the ground terminal GND1 and the ground terminal GND2.

Third Exemplary Embodiment

Figure 7:
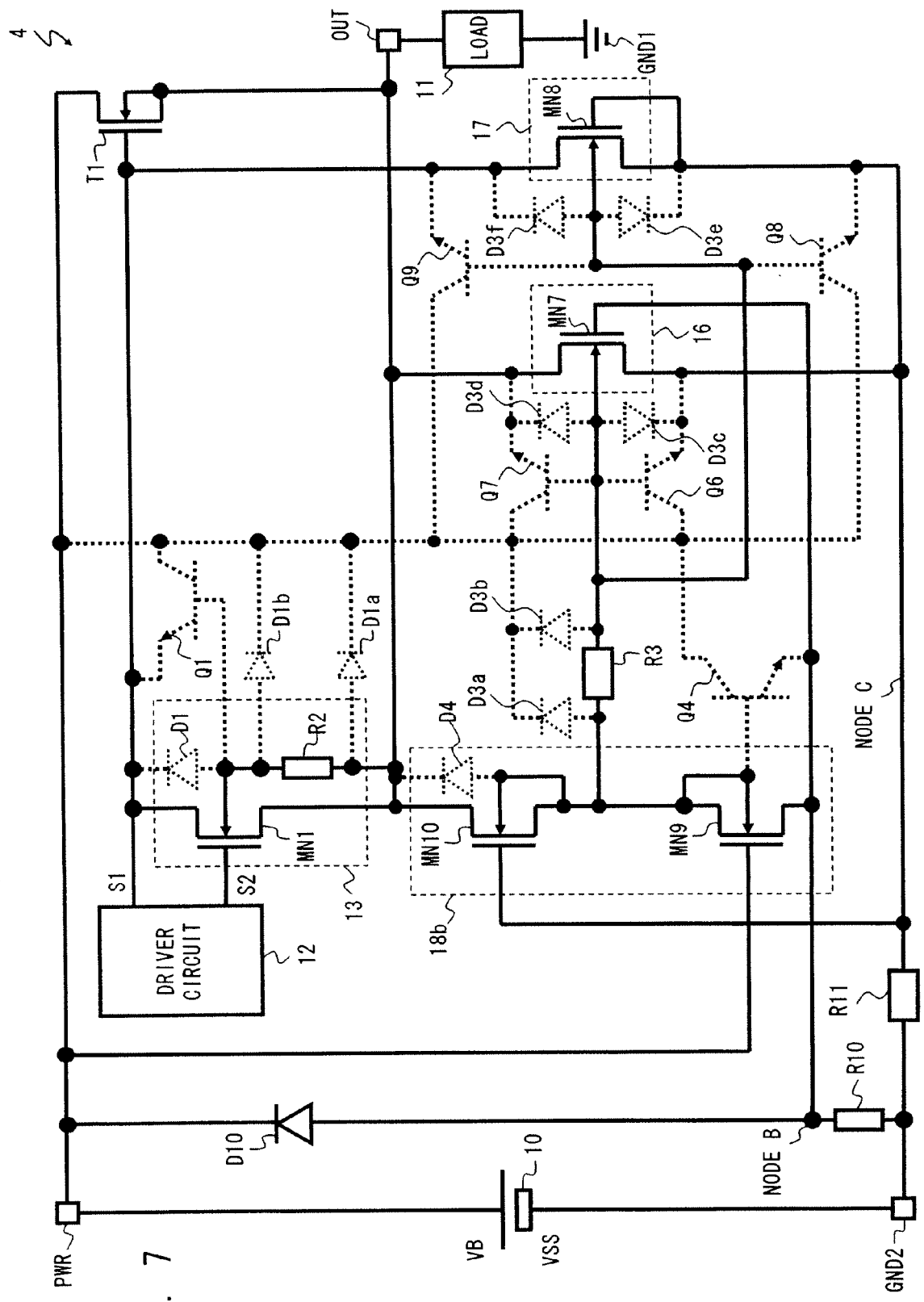
FIG. 7 is a circuit diagram of a load driving device according to a third exemplary embodiment of the present invention.
Figure 8:
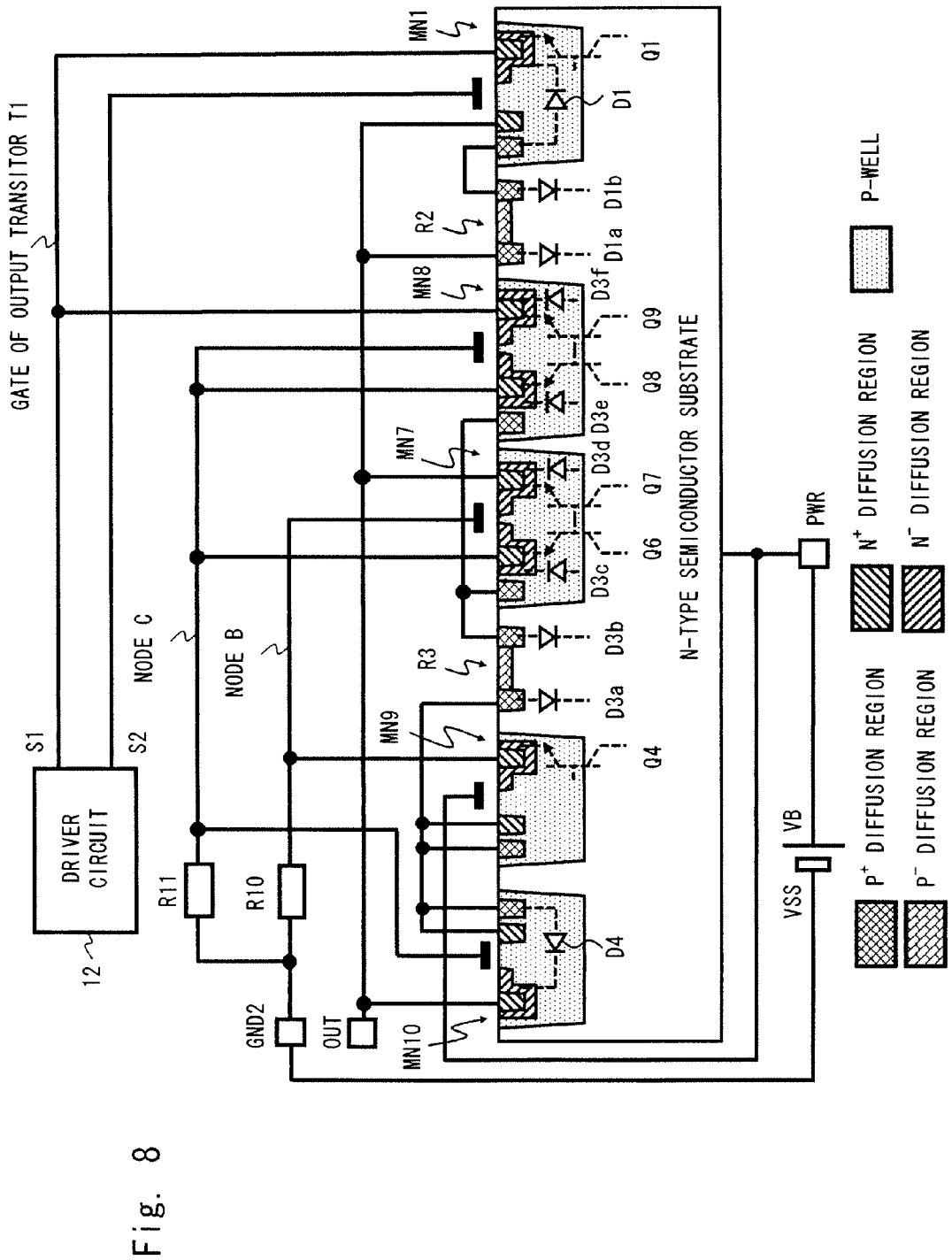
FIG. 8 is a sectional view of a semiconductor device illustrating parasitic elements formed in the load driving device according to the third exemplary embodiment of the present invention.
Figure 9:
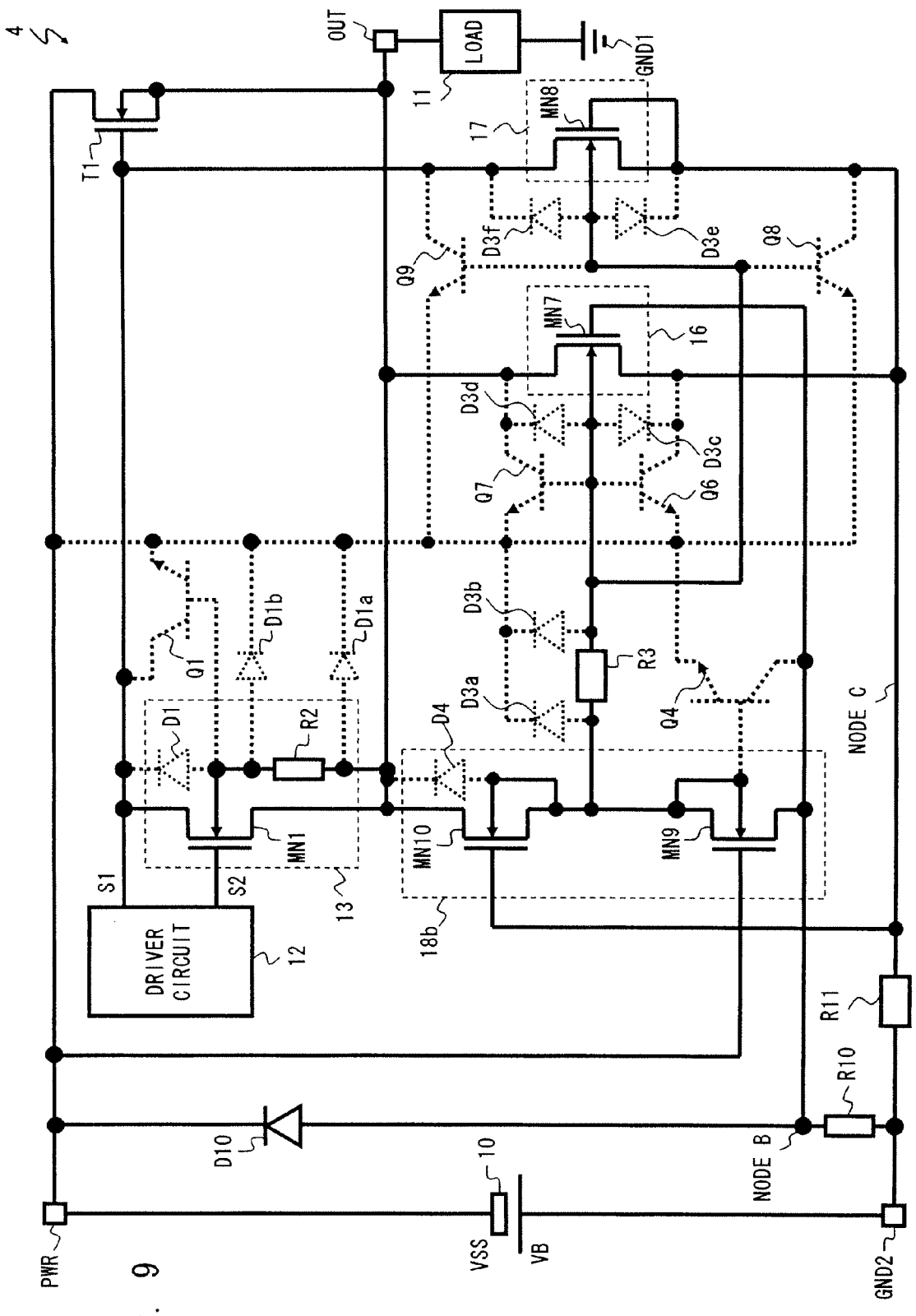
FIG. 9 is a circuit diagram showing a case where a power supply is reversely connected in the load driving device according to the third exemplary embodiment of the present invention.
Figure 10:
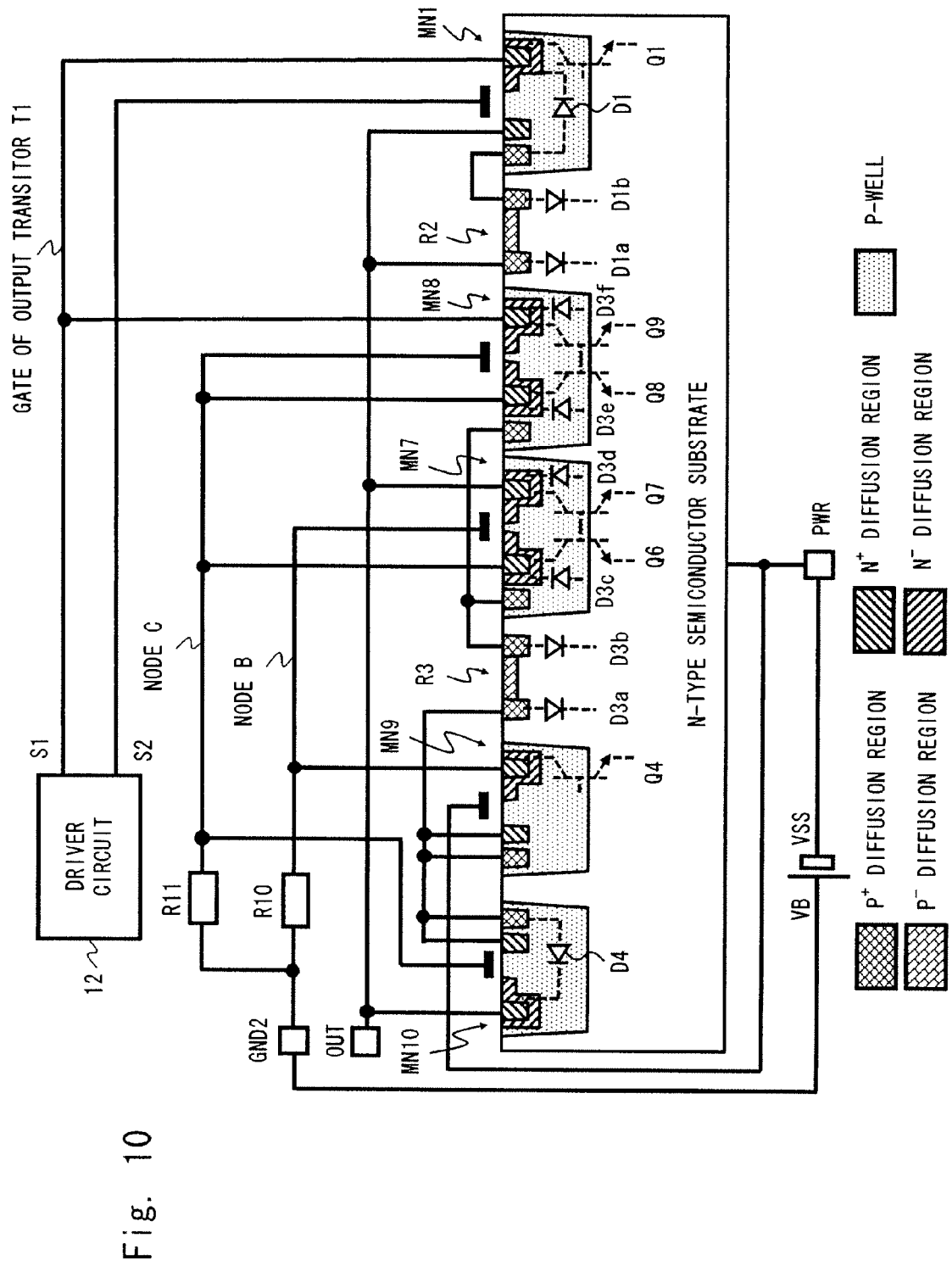
FIG. 10 is a sectional view of the semiconductor device illustrating the parasitic elements formed in the load driving device according to the third exemplary embodiment of the present invention.

FIG. 7 is a circuit diagram of a load driving device 4 according to a third exemplary embodiment of the present invention. FIG. 8 shows a sectional view illustrating devices constituting the load driving device 4 according to the third exemplary embodiment. FIG. 9 shows a circuit diagram of the load driving device 4 when the power supply is reversely connected, and FIG. 10 shows a sectional view illustrating devices constituting the load driving device 4 when the power supply is reversely connected. The load driving device 4 includes a back gate control circuit 18b as a modified example of the back gate control circuit 18 of the load driving device 3. Components of the load driving device 4 similar to those of the load driving device 3 are denoted by the same reference symbols, and the description thereof is omitted.

In comparison with the back gate control circuit 18 of the load driving device 3, the back gate control circuit 18b of the load driving device 4 causes the back gates of the compensation transistor MN7 and the protection transistor MN8 to be short-circuited to the potential of the output terminal OUT with a low impedance in the reverse connection mode, thereby obtaining a more stable operation.

The back gate control circuit 18b of the load driving device 4 includes a second N-type MOS transistor MN10 in addition to the first N-type MOS transistor MN9. The second N-type MOS transistor MN10 has a gate coupled to the node C, a drain coupled to the output terminal OUT, and a source and a back gate coupled to the source of the first N-type MOS transistor MN9.

Next, an operation of the load driving device 4 is described. In the normal operation and in the defective GND connection mode, the negative-polarity-side voltage VSS is applied to the gate of the second N-type MOS transistor MN10. Accordingly, the second N-type MOS transistor MN10 becomes non-conductive. That is, the operation of the load driving device 4 in the normal operation and in the defective GND connection mode is the same as the operation of the load driving device 3, so the description thereof is omitted.

In the reverse connection mode, the second N-type MOS transistor MN10 has a high gate (node C) voltage, a drain (output terminal OUT) voltage of about 0.7 V, a source voltage of about 0.7 V, and a back gate voltage of about 0.7 V. Accordingly, the second N-type MOS transistor MN10 becomes conductive. Due to the conduction of the second N-type MOS transistor MN10, the voltage of the back gate of each of the compensation transistor MN7 and the protection transistor MN8 is equal to the voltage of the output terminal OUT. In other words, the voltage of the output terminal OUT is supplied to the back gates of the compensation transistor MN7 and the protection transistor MN8 with a low impedance. This allows the protection transistor MN8 and the output transistor T1 to become conductive. In this manner, in the third exemplary embodiment, the same effects as those f the second exemplary embodiment can be obtained.

Fourth Exemplary Embodiment

Figure 11:
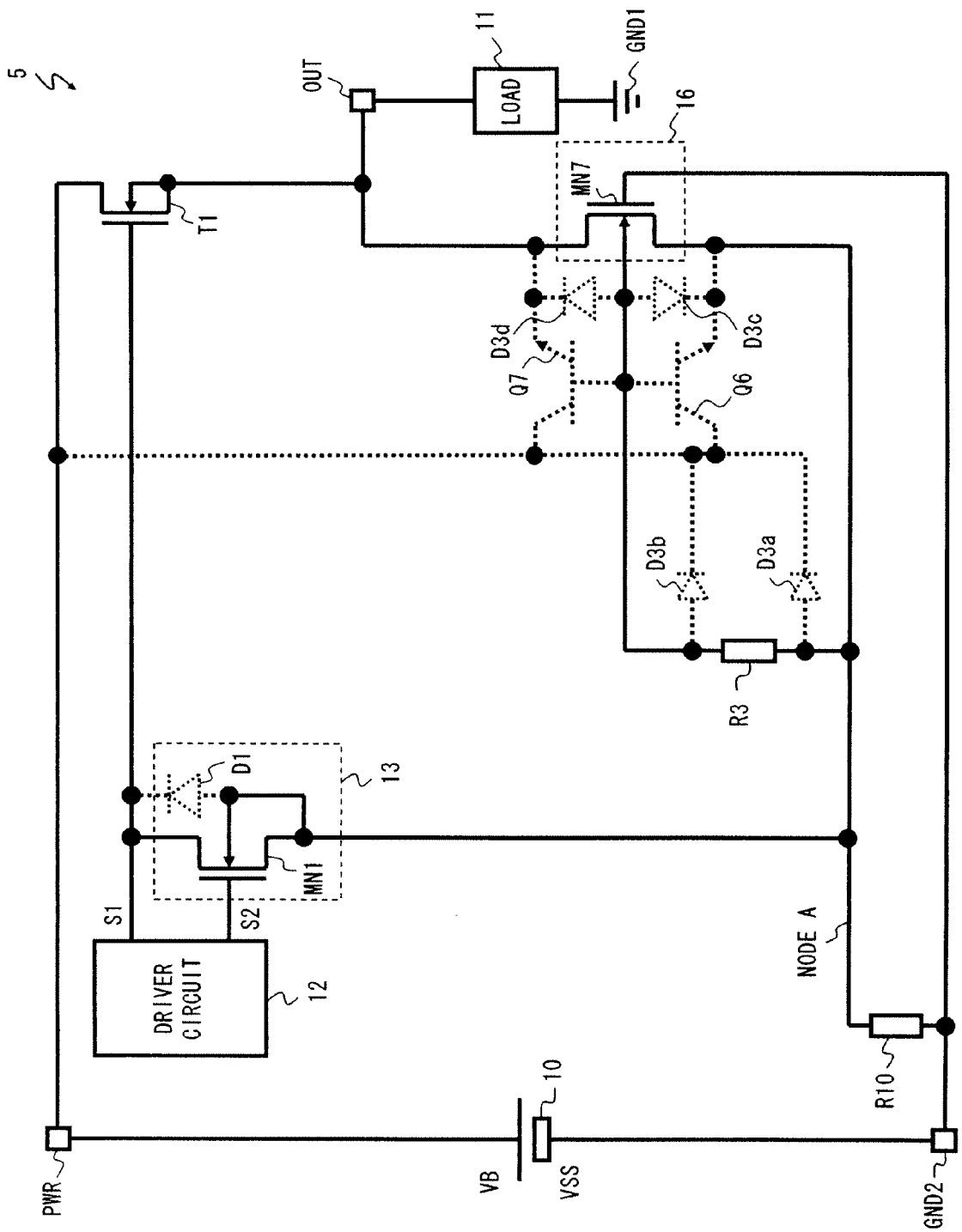
FIG. 11 is a circuit diagram of a load driving device according to a fourth exemplary embodiment of the present invention.
Figure 12:
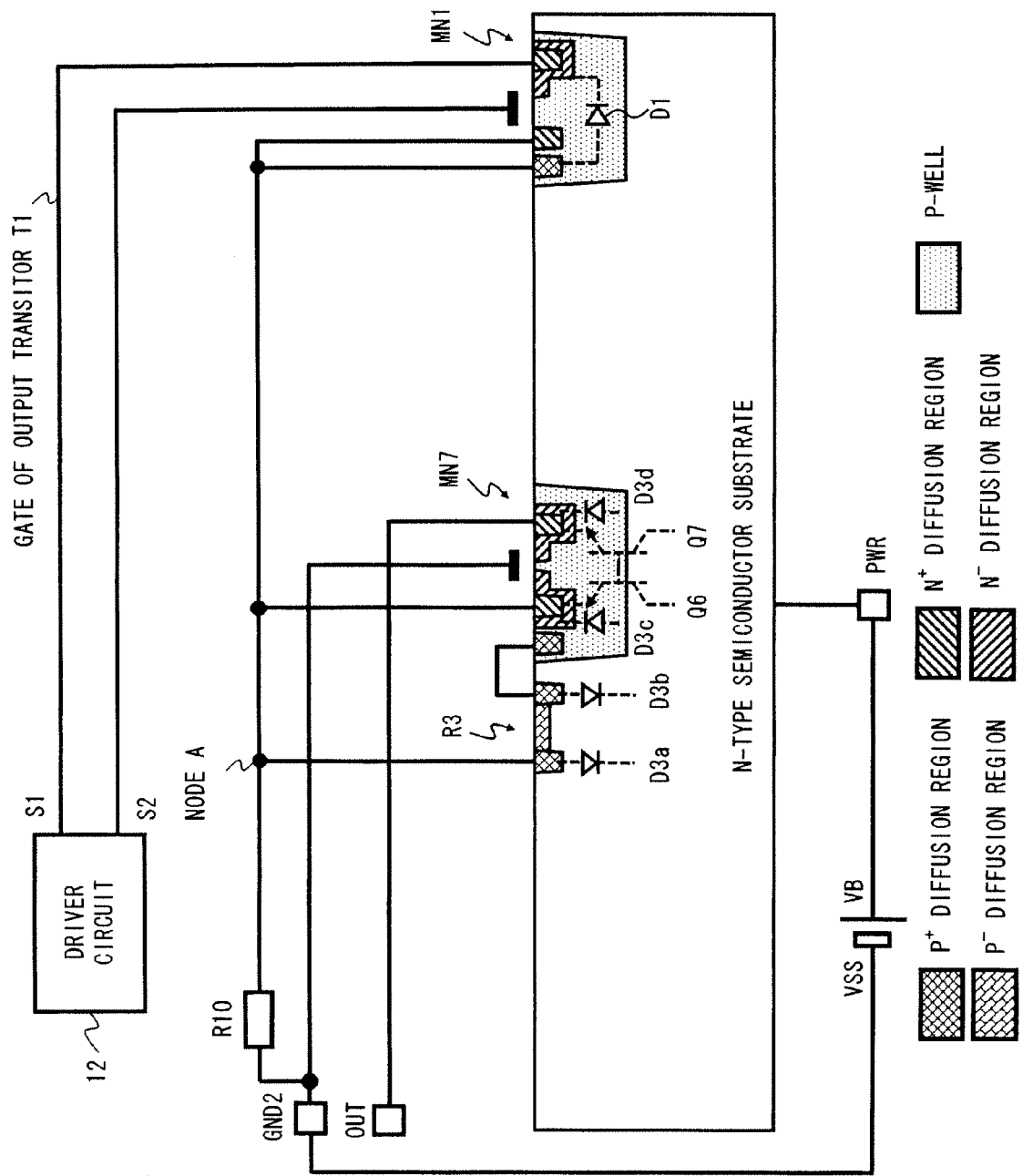
FIG. 12 is a sectional view of a semiconductor device illustrating parasitic elements formed in the load driving device according to the fourth exemplary embodiment of the present invention.
Figure 13:
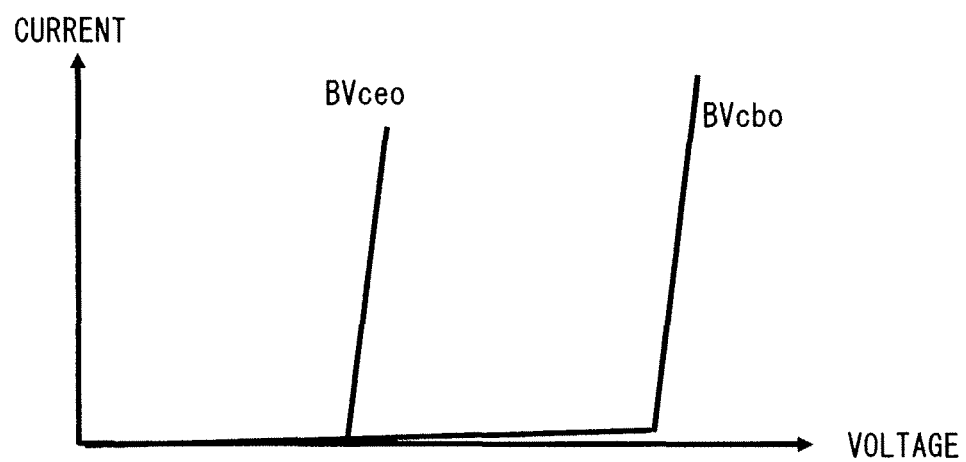
FIG. 13 is a graph showing breakdown voltage characteristics of a bipolar transistor.
Figure 14:
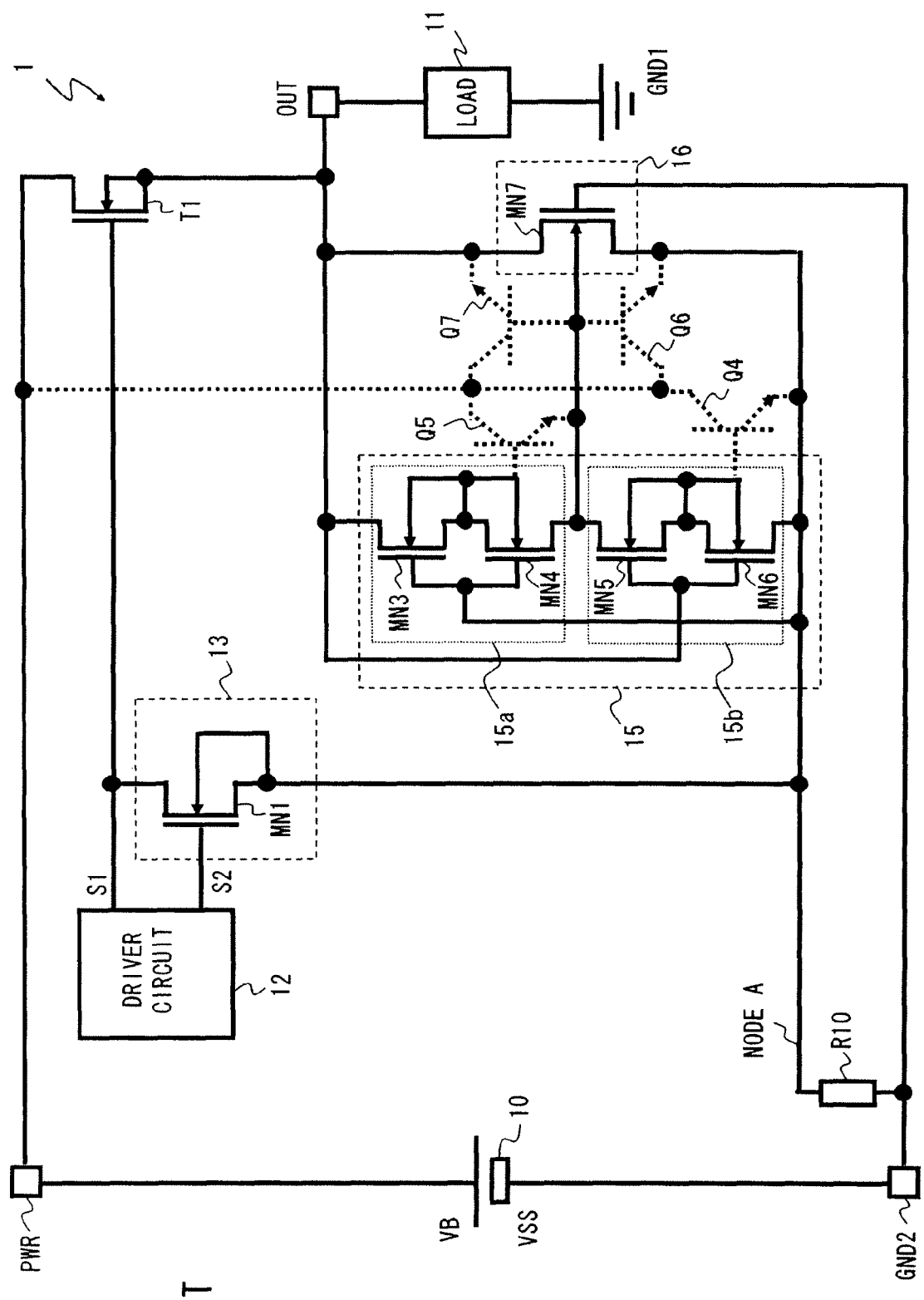
FIG. 14 is a circuit diagram of a load driving device according to a prior art.

FIG. 11 shows a circuit diagram of a load driving device 5 according to a fourth exemplary embodiment of the present invention. FIG. 12 shows a sectional view illustrating devices constituting the load driving device 5 according to the fourth exemplary embodiment. Unlike the load driving device 2, the load driving device 5 does not include the back gate control circuit 18. Thus, the functions of the load driving device 5 can be implemented using a smaller number of constituent elements than that of the load driving device 2.

An operation of the load driving device 5 is described. In the normal operation, the voltage (negative-polarity-side voltage VSS) of the ground terminal GND2 is supplied to the back gate of the compensation transistor MN7 through the resistor R3 and the resistor R10. This brings the compensation transistor MN7 into a non-conduction state. Similarly, the negative-polarity-side voltage VSS is supplied to the bases of the parasitic bipolar transistors Q6 and Q7. Thus, also in the state where the power supply 10 is at a high voltage level, the parasitic bipolar transistors Q6 and Q7 maintain the non-conduction state. In short, since no current flows through the parasitic bipolar transistors Q6 and Q7 in the standby state, the load driving device 5 can suppress an increase in consumption current. Further, the parasitic diodes D3a and D3b are reversely biased, and thus become non-conductive.

In the defective GND connection mode, when the voltage of the ground terminal GND2 increases, a current path is formed from the ground terminal GND2 to the parasitic diode D3d through the resistor R10 and the resistor R3. This current flows to the output terminal OUT through the parasitic diode D3d. Meanwhile, since the cathode of the parasitic diode D3c is coupled to the node A, the voltage at the anode of the parasitic diode D3c is substantially equal to the voltage at the cathode thereof. Accordingly, no current flows through the parasitic diode D3c. Note that no forward voltage is generated at the parasitic diodes D3a and D3b, because the voltage on the cathode side is equal to the positive-polarity-side voltage VB. In this case, for the same reason as the load driving device 2 according to the first exemplary embodiment, the resistance value of the resistor R3 is adjusted in advance, thereby preventing the forward voltage of the parasitic diode D3d from exceeding the threshold voltage of the parasitic bipolar transistor Q7. Thus, the parasitic bipolar transistor Q7 becomes non-conductive. At this time, in the compensation transistor MN7, the terminal coupled to the output terminal OUT serves as the source, and the terminal coupled to the node A serves as the drain. A voltage substantially equal to the voltage of the node A is applied to the gate of the compensation transistor MN7. Accordingly, the compensation transistor MN7 becomes conductive. In this manner, in the third exemplary embodiment, the same effects as those of the first exemplary embodiment can be obtained.

As described above, the load driving devices according to the above exemplary embodiments can maintain the non-conduction state of the output transistor T1 even when the voltage of the ground terminal GND2 increases due to a defective connection of a ground wire, thereby making it possible to prevent breakdown of the load driving device due to heat generation in the output transistor T1. Moreover, in the standby state when the power supply 10 is normally connected, the load driving devices according to the above exemplary embodiments can maintain the non-conduction state of the parasitic bipolar transistors even when the load driving device operates at an allowable maximum power supply voltage, thereby making it possible to suppress an increase in power consumption.

The present invention is not limited to the above exemplary embodiments, but can be modified in various manners without departing from the scope of the present invention. While the above exemplary embodiments show an example in which the elements are formed on a single semiconductor substrate, the present invention is not limited thereto. In other words, the present invention is not limited to the configuration in which the elements are formed on a single semiconductor substrate.

The first to fourth exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A load driving device comprising:
    an output transistor coupled between a first power supply line and an output terminal, the output terminal being configured to be coupled with a load;
    a driver circuit that controls conduction/non-conduction of the output transistor;
    a compensation transistor that is coupled between the output terminal and a second power supply line, and becomes conductive when the driver circuit renders the output transistor non-conductive and when a potential of the second power supply line reaches a predetermined value or greater, to maintain a non-conduction state of the output transistor; and
    a first resistor coupled between the second power supply line and a back gate of the compensation transistor.

2. The load driving device according to claim 1, further comprising:
    a discharge transistor that is coupled between a gate of the output transistor and the output terminal, and becomes conductive when the driver circuit renders the output transistor non-conductive.

3. The load driving device according to claim 1, further comprising:
    a protection transistor that renders the output transistor conductive when a power supply coupled between the first power supply line and the second power supply line has a reversed polarity, wherein the protection transistor has a back gate coupled to a connection node between the back gate of the compensation transistor and the first resistor.

4. The load driving device according to claim 3, further comprising:
    a back gate control circuit that is coupled between the second power supply line and the first resistor, and couples the second power supply line and the first resistor when a power supply coupled between the first power supply line and the second power supply line has a normal polarity.

5. The load driving device according to claim 4, wherein the back gate control circuit comprises a first transistor that controls conduction/non-conduction between the second power supply line and the back gate of the compensation transistor according to a voltage of the first power supply line.

6. The load driving device according to claim 4, wherein the back gate control circuit comprises a first transistor having a first terminal and a back gate coupled to the first resistor, a gate coupled to the first power supply line, and a second terminal coupled to the second power supply line.

7. The load driving device according to claim 6, wherein the back gate control circuit further comprises a second transistor having a first terminal coupled to the output terminal, a second terminal and a back gate coupled to the first terminal and the back gate of the first transistor, and a gate coupled to the second power supply line.

8. The load driving device according claim 4, further comprising: a second resistor provided between the back gate control circuit and the second power supply line.

9. The load driving device according to claim 8, further comprising: a protection diode having an anode coupled to a node between the second resistor and the back gate control circuit, and a cathode coupled to the first power supply line.

10. The load driving device according to claim 2, wherein the discharge transistor is coupled between the gate and a source of the output transistor, and the load driving device further comprises a third resistor coupled between a back gate of the discharge transistor and the source of the output transistor.

11. The load driving device according to claim 10, wherein the third resistor is a diffusion resistor.

12. The load driving device according to claim 8, wherein the compensation transistor has a first terminal coupled to the output terminal, a second terminal coupled to the second power supply line through a fourth resistor, a gate coupled to the second power supply line through the second resistor, and a back gate coupled to the back gate control circuit through the first resistor.

13. The load driving device according to claim 8, wherein the compensation transistor has a first terminal coupled to the output terminal, a second terminal coupled to the second power supply line through the second resistor, a gate coupled to the second power supply line, and a back gate coupled to the second power supply line through the first resistor and the second resistor.

14. The load driving device according to claim 3, wherein the protection transistor is a diode-connected transistor having a cathode-side terminal coupled to a gate of the output transistor, and an anode-side terminal coupled to the second power supply line through a fourth resistor.

15. The load driving device according to claim 1, wherein the first resistor is a diffusion resistor.

16. A load driving device comprising:
    an output transistor coupled between a first power supply line and an output terminal, the output terminal being configured to be coupled with a load;
    a compensation transistor that is coupled between the output terminal and a second power supply line, and becomes conductive when the output transistor is rendered nonconductive and when a potential of the second power supply line reaches a predetermined value or greater, to maintain a non-conduction state of the output transistor; and
    a first resistor coupled between the second power supply line and a back gate of the compensation transistor.

17. The load driving device according to claim 16, further comprising a discharge transistor that is coupled between a gate of the output transistor and the output terminal, and becomes conductive when the output transistor is rendered non-conductive.

18. The load driving device according to claim 16, further comprising a protection transistor that renders the output transistor conductive when a power supply coupled between the first power supply line and the second power supply line has a reversed polarity, wherein the protection transistor includes a back gate coupled to a connection node between the back gate of the compensation transistor and the first resistor.

19. The load driving device according to claim 16, further comprising a back gate control circuit that is coupled between the second power supply line and the first resistor, and couples the second power supply line and the first resistor when a power supply coupled between the first power supply line and the second power supply line has a normal polarity.

* * * * *